United States Patent
Tarui et al.

(10) Patent No.: US 10,128,340 B2
(45) Date of Patent: Nov. 13, 2018

(54) POWER SEMICONDUCTOR DEVICE

(71) Applicant: Mitsubishi Electric Corporation, Tokyo (JP)

(72) Inventors: Yoichiro Tarui, Tokyo (JP); Toshikazu Tanioka, Tokyo (JP); Yasunori Oritsuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/546,246

(22) PCT Filed: Mar. 18, 2015

(86) PCT No.: PCT/JP2015/058102
§ 371 (c)(1),
(2) Date: Jul. 25, 2017

(87) PCT Pub. No.: WO2016/147352
PCT Pub. Date: Sep. 22, 2016

(65) Prior Publication Data
US 2018/0019308 A1  Jan. 18, 2018

(51) Int. Cl.
*H01L 29/08* (2006.01)
*H01L 29/06* (2006.01)
(Continued)

(52) U.S. Cl.
CPC .......... *H01L 29/1608* (2013.01); *H01L 29/06* (2013.01); *H01L 29/0684* (2013.01);
(Continued)

(58) Field of Classification Search
CPC ..... H01L 29/06; H01L 29/12; H01L 29/0684; H01L 29/0878; H01L 29/739;
(Continued)

(56) References Cited

U.S. PATENT DOCUMENTS 7,221,010 B2   5/2007  Ryu
8,890,169 B2  11/2014  Kameshiro et al.
(Continued)

FOREIGN PATENT DOCUMENTS

JP   2006-511961 A   4/2006
JP   2007-184434 A   7/2007
(Continued)

OTHER PUBLICATIONS

An Office Action; "Notification of Reasons for Refusal" issued by the Japanese Patent Office dated Aug. 1, 2017, which rresponds to Japanese Patent Application No. 2017-505953 and is related to U.S. Appl. No. 15/546,246; with partial English translation.
(Continued)

*Primary Examiner* — Chuong A Luu
(74) *Attorney, Agent, or Firm* — Studebaker & Brackett PC

(57) ABSTRACT

The present invention relates to a power semiconductor device which includes: a first conductivity-type silicon carbide semiconductor layer; a switching device which is formed on the silicon carbide semiconductor layer; a second conductivity-type electric field relaxation impurity region which is formed in a terminal portion of a formation region of the switching device and which relaxes an electric field of the terminal portion; and a first conductivity-type added region which is provided between second conductivity-type well regions of a plurality of unit cells that constitutes the switching device, and at least on an outer side of the electric field relaxation impurity region, and which has an impurity concentration higher than that in the silicon carbide semiconductor layer.

12 Claims, 20 Drawing Sheets

(51) Int. Cl.
  *H01L 29/16* (2006.01)
  *H01L 29/739* (2006.01)
  *H01L 29/12* (2006.01)
  *H01L 29/78* (2006.01)
  *H01L 29/66* (2006.01)

(52) U.S. Cl.
  CPC .......... *H01L 29/0878* (2013.01); *H01L 29/12* (2013.01); *H01L 29/66068* (2013.01); *H01L 29/739* (2013.01); *H01L 29/7816* (2013.01)

(58) Field of Classification Search
  CPC ............... H01L 29/7816; H01L 29/808; H01L 29/8083; H01L 29/1608; H01L 29/66068; H01L 29/08; H01L 29/16
  USPC .......................................................... 257/77
  See application file for complete search history.

(56) References Cited

U.S. PATENT DOCUMENTS 9,570,541 B2   2/2017   Mizushima

2002/0179022 A1* 12/2002 Linn .................... A01K 1/0613
119/729
2013/0285071 A1* 10/2013 Kameshiro ......... H01L 29/0615
257/77

FOREIGN PATENT DOCUMENTS

| | | |
|---|---|---|
| JP | 2007-266520 A | 10/2007 |
| JP | 2011-258640 A | 12/2011 |
| WO | 2004/061974 A2 | 7/2004 |
| WO | 2010/001201 A1 | 1/2010 |
| WO | 2012/063310 A1 | 5/2012 |
| WO | 2012/081664 A1 | 6/2012 |

OTHER PUBLICATIONS

International Search Report issued in PCT/JP2015/058102; dated Jun. 9, 2015.
International Preliminary Report on Patentability issued in PCT/JP2015/058102; dated Sep. 28, 2017.
JP Office Action dated Feb. 13, 2018, from corresponding JP Appl No. 2017-505953, with English translation, 6 pp.

* cited by examiner

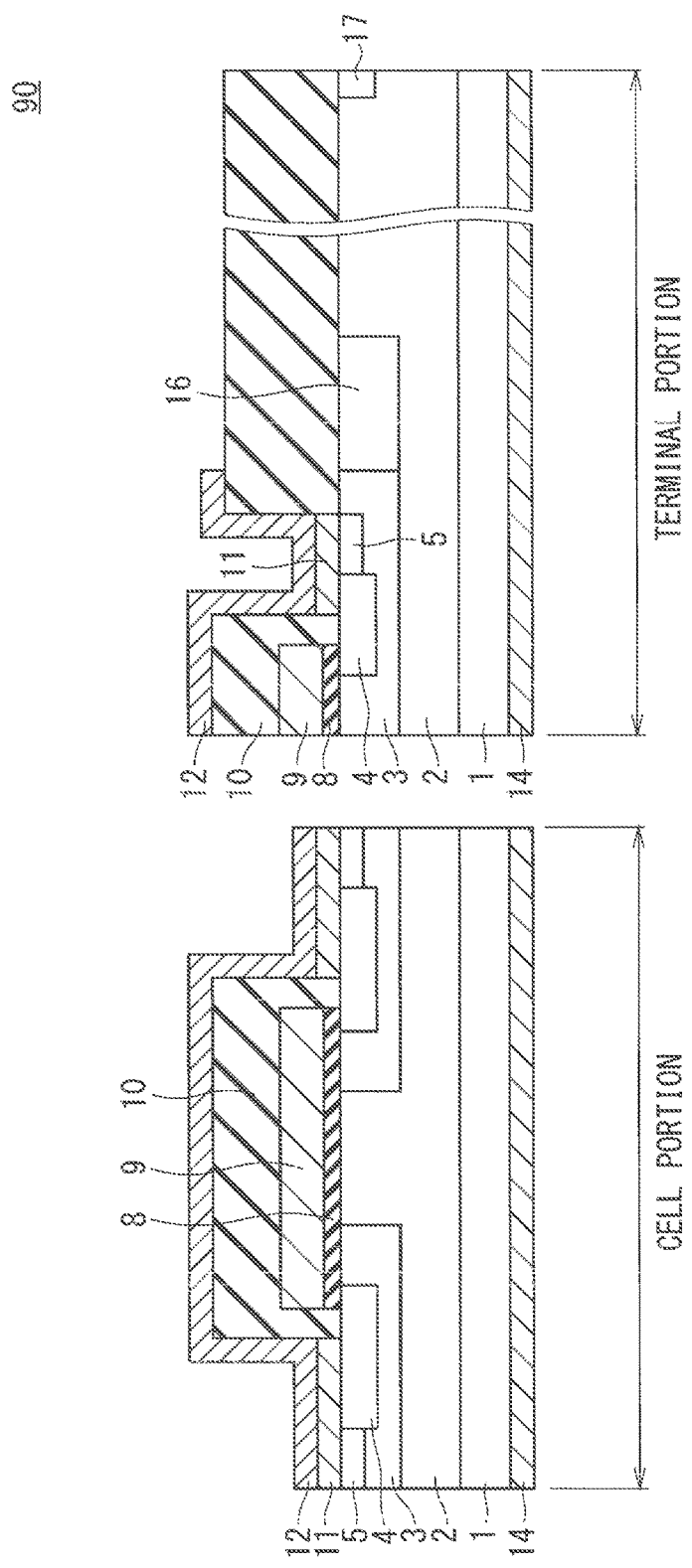
F I G . 2

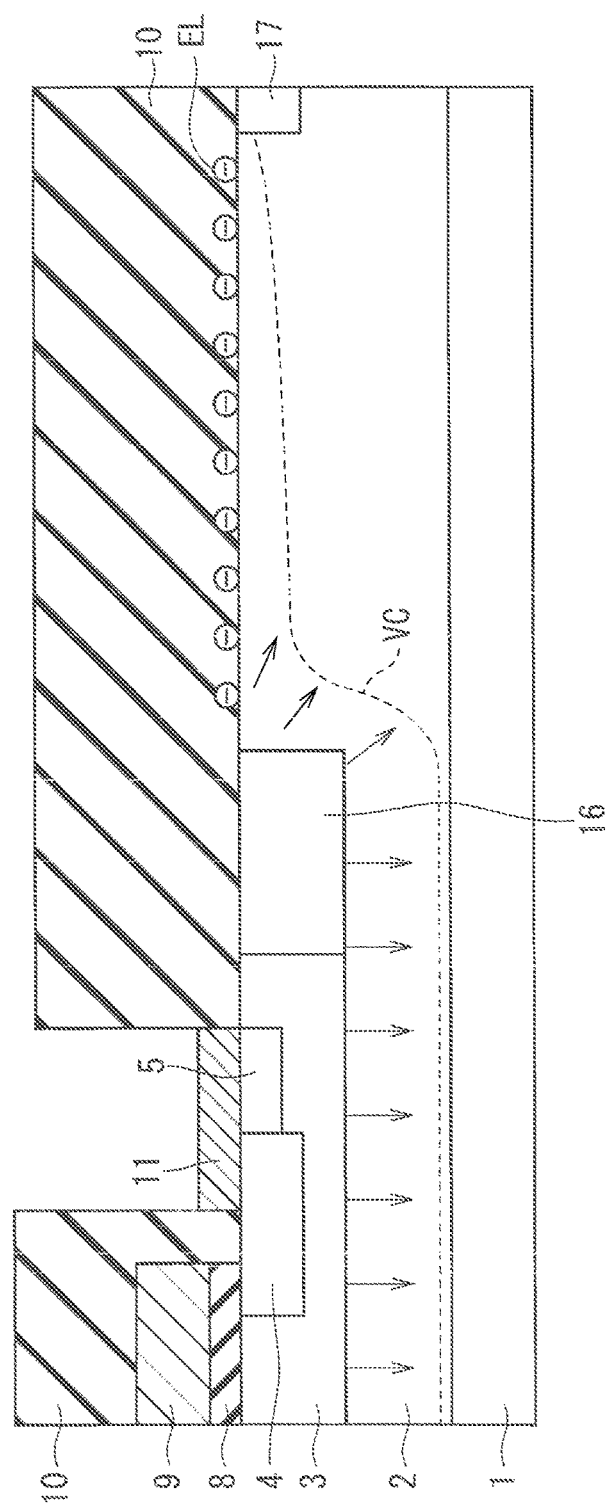
F I G. 4

F I G. 6
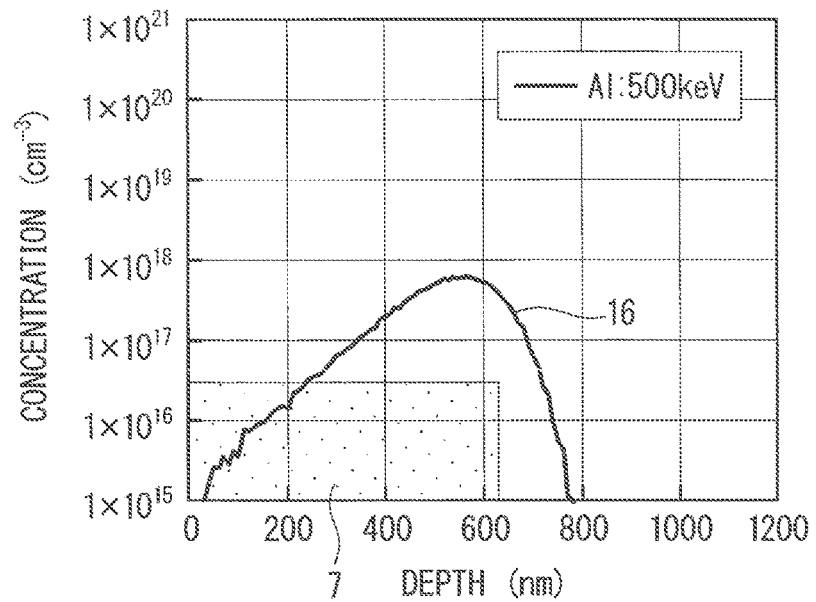
F I G. 7
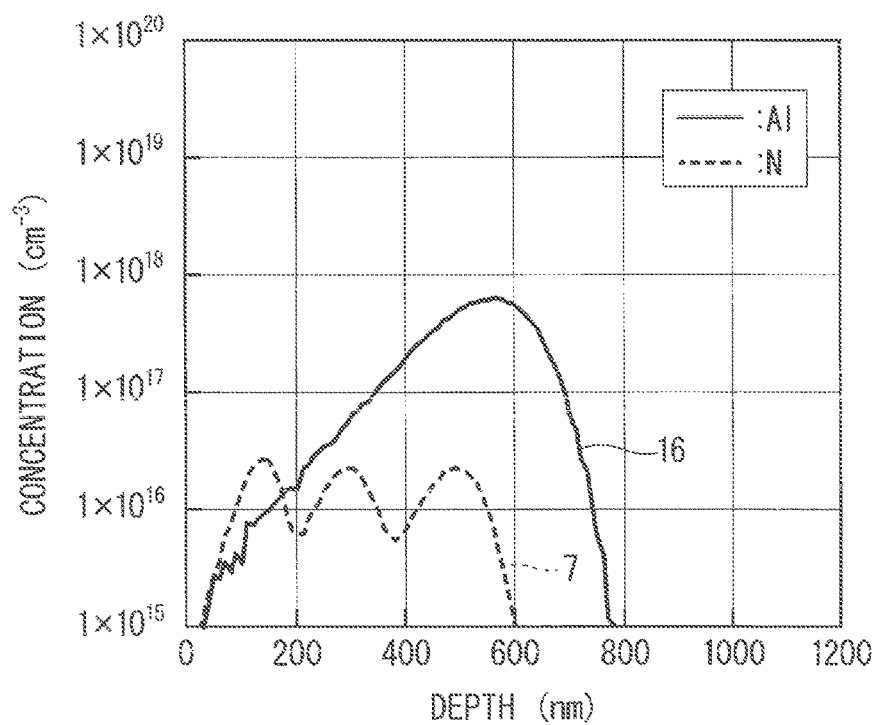

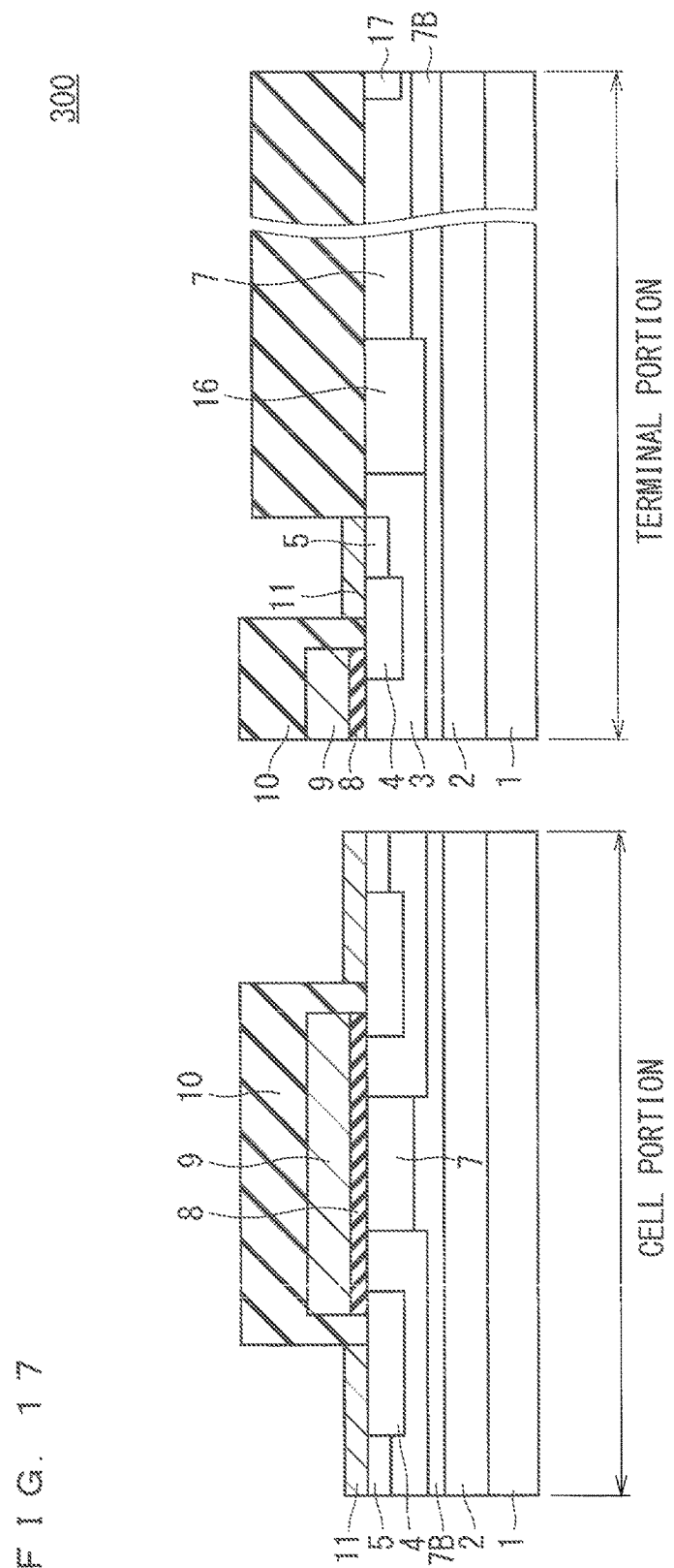
F I G. 1 7

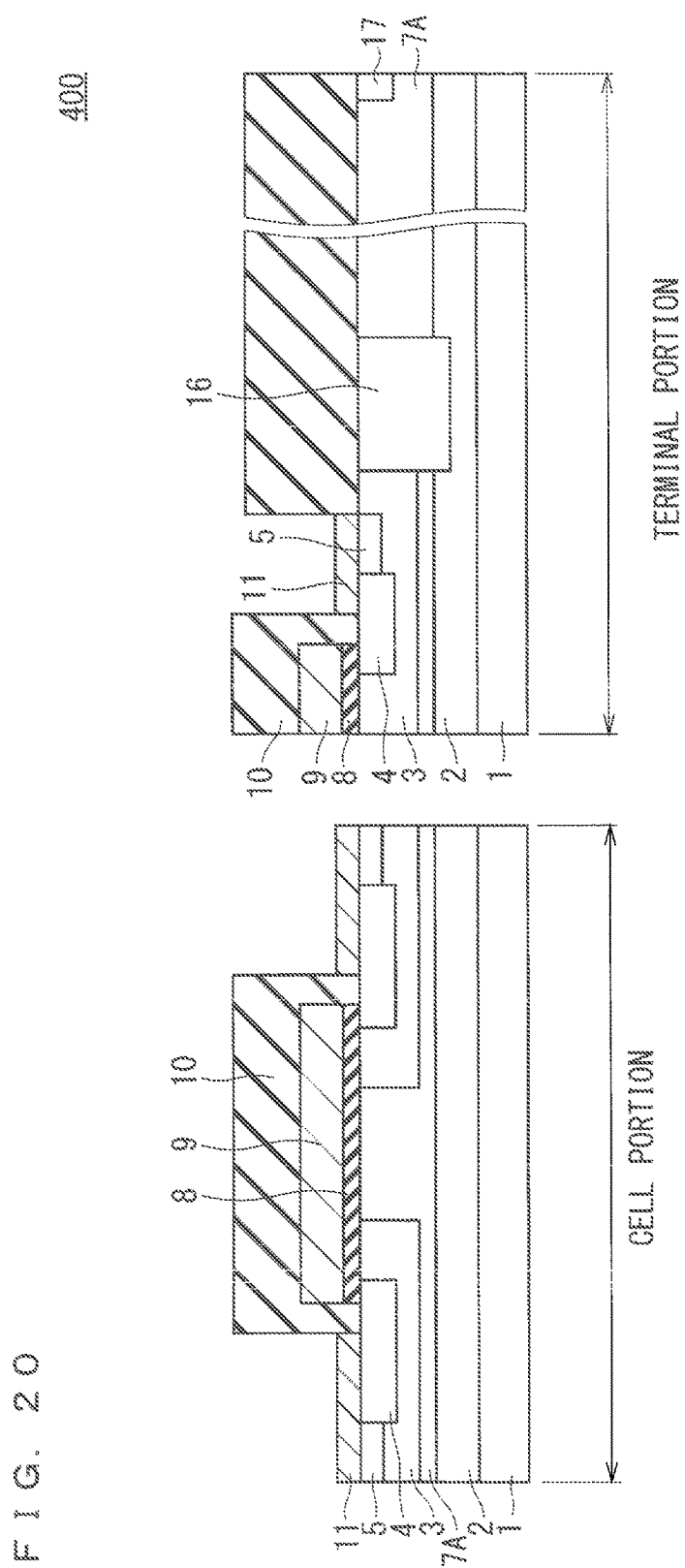
F I G. 20

US 10,128,340 B2

POWER SEMICONDUCTOR DEVICE

TECHNICAL FIELD

The present invention relates to a power semiconductor device such as a silicon carbide semiconductor device.

BACKGROUND ART

Various efforts are made to lower on-resistance of a power switching device using a wide-bandgap semiconductor such as silicon carbide (SiC), the on-resistance being one of performance indexes of the power switching device. For example, as disclosed in FIG. 2A of Patent Document 1, in order to lower on-resistance of the switching device, an n-type region with a higher concentration than that in a drift region is formed between p-wells, or an n-type JFET limiting region with a higher concentration than that in the drift region is formed on the lower side of the p-well.

As described, a configuration is known where an n-type region is formed between p-wells in order to lower on-resistance of a switching device, and examples of the performance indexes of a power switching device include a withstand-voltage keeping capability in addition to the on-resistance.

In a case where electric field relaxation due to a structure (terminal structure) of a terminal portion of a switching device is insufficient, withstand voltage and reliability of the switching device are affected; however, conventionally, a configuration which not only reduces on-resistance of a switching device but also improves the withstand-voltage keeping capability of the switching device is not disclosed.

PRIOR ART DOCUMENT

Patent Document

Patent Document 1: Japanese Unexamined Patent Application Publication (Translation of PCT Patent Application) No. 2006-511961

SUMMARY OF INVENTION

Problems to be Solved by the Invention

As explained above, conventionally, a configuration which not only reduces on-resistance of a switching device but also improves a withstand-voltage keeping capability is not disclosed, and it is difficult to improve the yield rate of switching devices while securing the withstand voltage and the reliability of the switching devices.

The present invention is made in order to solve the above problem, and an object of the present invention is to provide a power semiconductor device in which on-resistance of a switching device is reduced and a withstand-voltage keeping capability is improved.

Means for Solving the Problems

A power semiconductor device according to the present invention includes: a first conductivity-type silicon carbide semiconductor layer; a switching device which is formed on the silicon carbide semiconductor layer; a second conductivity-type electric field relaxation impurity region which is formed in a terminal portion of a formation region of the switching device and which relaxes an electric field of the terminal portion; and a first conductivity-type added region which is provided between second conductivity-type well regions of a plurality of unit cells that constitutes the switching device, and at least on an outer side of the electric field relaxation impurity region, and which has an impurity concentration higher than that in the silicon carbide semiconductor layer.

Effects of the Invention

According to the power semiconductor device according to the present invention, resistance of a JFET region between the well regions is lowered and thus on-resistance of the switching device is lowered, elongation of a depletion layer in the terminal portion is suppressed, and thus lowering of a withstand-voltage keeping capability can be suppressed. In addition, since the depletion layer is less likely to be elongated, the size of the region to which an electric field is applied is diminished. Therefore, even in a case where there is a defect on a surface of the terminal portion or adhesion of foreign matter to the surface of the terminal portion, the possibility of the above defect or adhesion occurring at a section to which an electric field is applied is lowered, the manufacturing yield rate of switching devices is improved, and reliability of the switching devices is improved.

BRIEF DESCRIPTION OF DRAWINGS

FIG. 2 is a partial cross-sectional view of the field-effect transistor having the general MOS structure.

FIG. 4 is a schematic view for explaining elongation of a depletion layer in a terminal portion of the field-effect transistor having the general MOS structure.

FIG. 6 is a diagram illustrating an impurity profile of the silicon carbide MOS transistor according to the first embodiment of the present invention.

FIG. 7 is a diagram illustrating an impurity profile of the silicon carbide MOS transistor according to the first embodiment of the present invention.

FIG. 17 is a partial cross-sectional view of a silicon carbide MOS transistor according to a third embodiment of the present invention.

FIG. 20 is a partial cross-sectional view of a silicon carbide MOS transistor according to a fourth embodiment of the present invention.

DESCRIPTION OF EMBODIMENTS

<Introduction>

The term "MOS" was in the past used for a metal/oxide/semiconductor junction structure, and is an abbreviation for Metal-Oxide-Semiconductor. However, especially in a field-effect transistor with a MOS structure (hereinafter simply referred to as a "MOS structure"), materials for a gate insulating film and a gate electrode are improved from viewpoints of integration, improvement in manufacturing processes, and the like in recent years.

For example, in MOS transistors, mainly from a viewpoint of forming a source and a drain in a self-alignment manner, polycrystal silicon is more likely to be adopted in lieu of a metal as a material of a gate electrode. In addition, from a viewpoint of improving an electrical characteristic, a high-dielectric material is adopted as a material of a gate insulating film; however, the material is not necessarily limited to an oxide.

Therefore, the term "MOS" is not necessarily adopted such that the term is limited to a metal/oxide/semiconductor lamination structure. Also in the present description, such limitation is not a premise. That is, in light of technical common knowledge, here, "MOS" has not only a meaning as an abbreviation derived from its word origin, but also a meaning including a conductor/insulator/semiconductor lamination structure in a broad sense.

First Embodiment

<Device Configuration>

Figure 1:
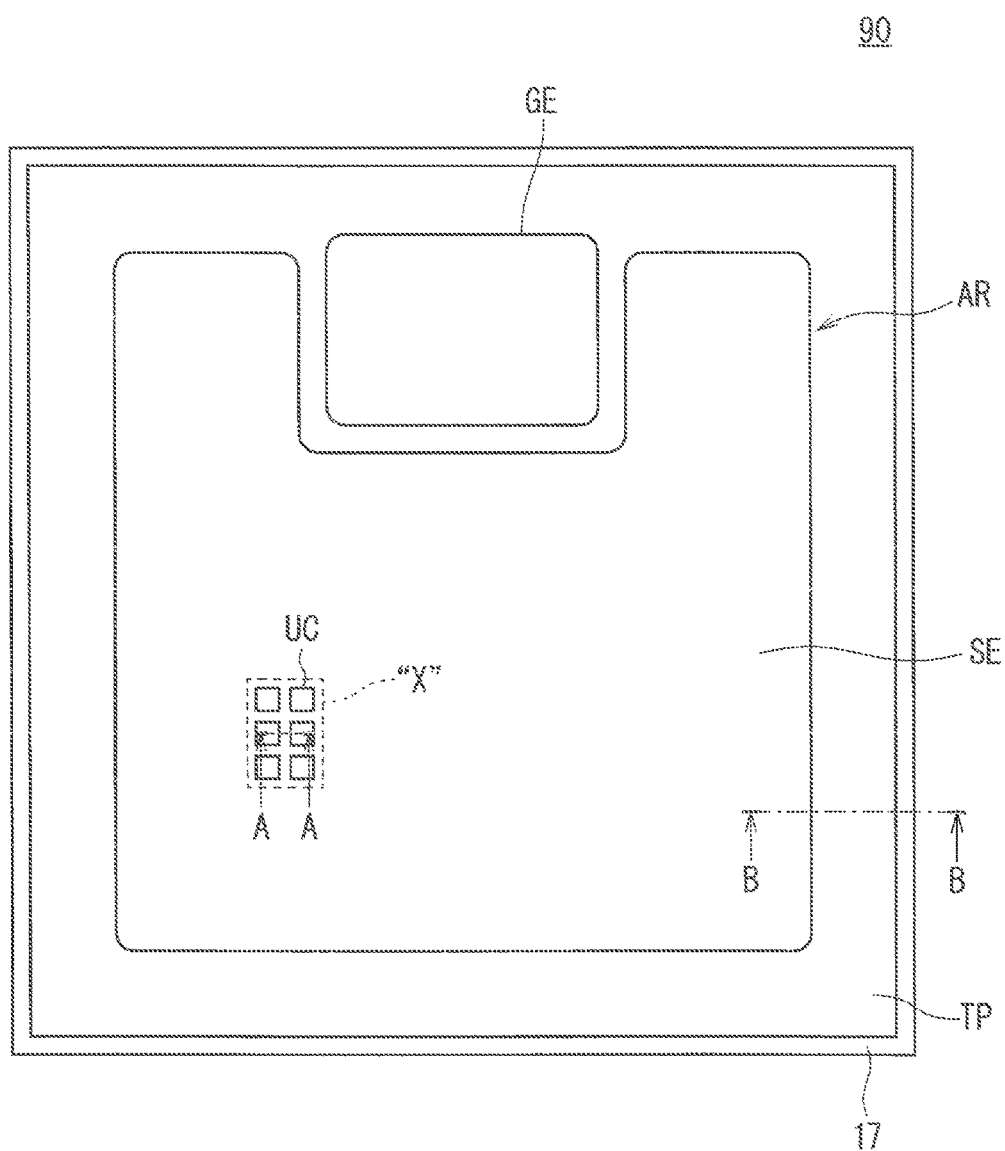
FIG. 1 is a plan view illustrating a top-view configuration of a field-effect transistor having a general MOS structure.

FIG. 1 is a plan view illustrating a top-view configuration of a field-effect transistor (silicon carbide MOS transistor) 90 having a general MOS structure formed on a silicon carbide (SiC) substrate.

As illustrated in FIG. 1, the silicon carbide MOS transistor 90 is provided with a source pad SE which is located at a central portion of a main surface of a chip with a rectangular outer shape. The shape of the source pad SE in plan view is a shape where a central portion of one side of the rectangle is recessed inward, and a gate pad GE is provided so as to enter the inwardly recessed portion of the source pad SE. Note that in a region "X" in FIG. 1, for the sake of convenience, a portion of the source pad SE is omitted to illustrate unit cells UC provided under the source pad SE.

The gate pad GE is a section to which a gate voltage is applied from an external control circuit (not illustrated), and the gate voltage applied here is supplied through gate wiring (not illustrated) to a gate electrode (not illustrated) of the unit cell UC, which is a minimum unit structure of the MOS transistor.

The source pad SE is provided on an active region AR where the plurality of unit cells UC is arranged, and has a configuration such that source electrodes (not illustrated) of the respective unit cells UC are connected in parallel.

The outer side of the active region AR where the unit cells UC are formed is a terminal portion TP, and the terminal portion TP is provided with a JTE (Junction Termination Extension) region (not illustrated) or the like as an electric field relaxation structure. In addition, a channel stop region 17 is provided on an outer side of the terminal portion TP. Note that even though the channel stop region 17 cannot be seen from a top side since it is formed in a substrate surface; however, for the sake of convenience, the channel stop region 17 is illustrated as if it can be seen.

Note that regarding the location and the number of gate pads GE, and the shape and the number of source pads SE, and the like, there may be various types and various cases depending on the MOS transistor; however, since these are remotely related to the configurations and effects of the present invention, explanation and illustration of them will be omitted.

FIG. 2 illustrates the configuration of the cross section of a cell portion indicated by line A-A in FIG. 1, and the configuration of the cross section of the terminal portion indicated by line B-B.

As illustrated in FIG. 2, the silicon carbide MOS transistor 90 includes an n-type drift layer 2 formed on a main surface of a silicon carbide substrate 1 including an n-type impurity, and a drain electrode 14 formed on a back-surface side (side opposite to the main-surface side where the source pad SE is provided) of the silicon carbide substrate 1.

In addition, in an upper layer portion of the drift layer 2, a plurality of p-type well regions 3 selectively formed, a p-type JTE region 16 defining an outer edge of the active region AR, and the channel stop region 17 provided apart from the JTE region 16 are provided.

In a surface of the well region 3, an n-type source region 4, and a p-type contact region 5 connected to an inner end surface of the source region 4 are provided. Note that a contact region 5 is also provided in the terminal portion TP; however, in the terminal portion TP, the contact region 5 is provided to be connected to an end surface of a source region 4 on the side facing the JTE region 16.

On a main surface of the drift layer 2, a gate insulating film 8 is formed to cover the portion between the adjacent well regions 3, and edge portions of the well regions 3 and edge portions of the source regions 4, and a gate electrode 9 is formed on the gate insulating film 8.

The gate insulating film 8 and the gate electrode 9 are covered with an interlayer insulating film 10, and the interlayer insulating film 10 is provided to cover also the drift layer 2 in the terminal portion TP.

On upper portions of the source region 4 and the contact region 5 not covered with the interlayer insulating film 10, an ohmic electrode 11 made of, for example, nickel (Ni) is formed, and a source electrode 12 is formed on the ohmic electrodes 11 and the interlayer insulating film 10. This source electrode 12 configures the source pad SE.

Figure 3:
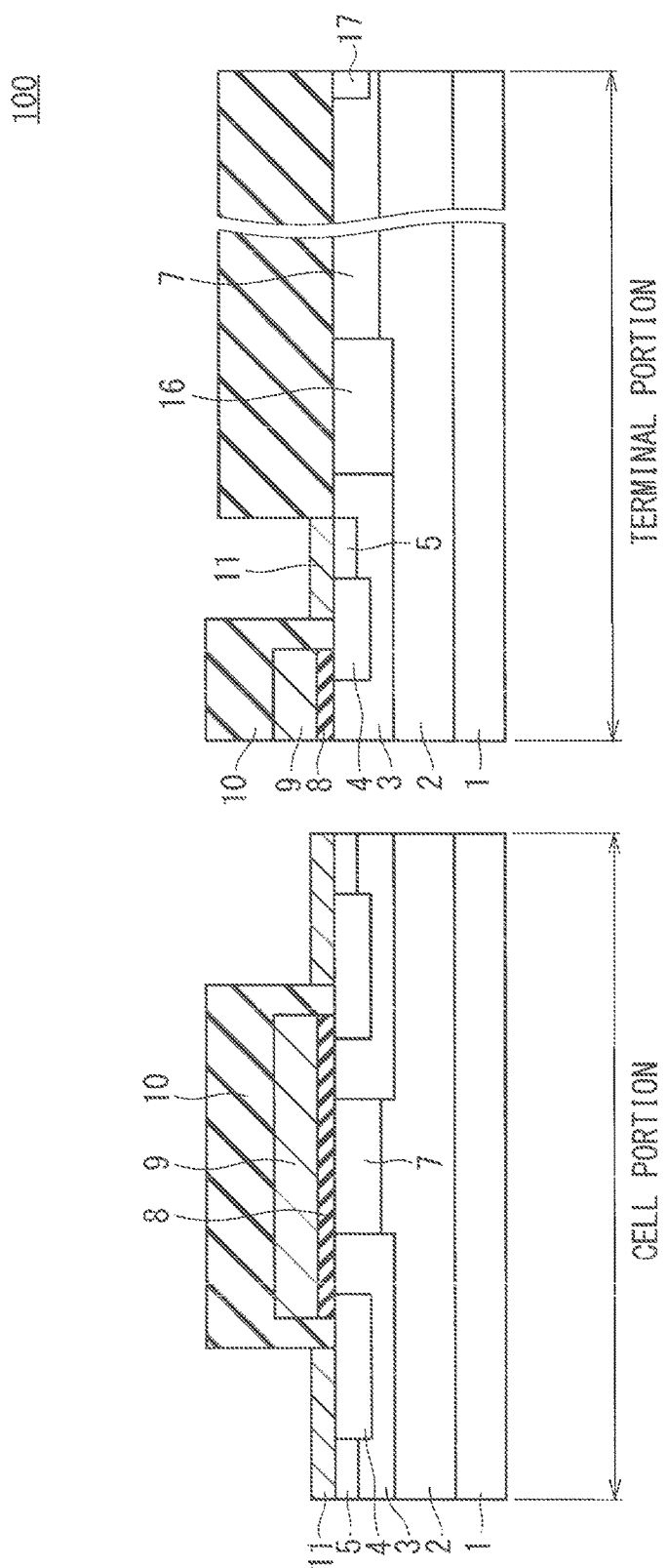
FIG. 3 is a partial cross-sectional view of a silicon carbide MOS transistor according to a first embodiment of the present invention.

In contrast to the general silicon carbide MOS transistor 90 explained above, a cross-sectional configuration of a silicon carbide MOS transistor 100 according to a first embodiment of the present invention is illustrated in FIG. 3. Note that in FIG. 3, for the sake of convenience, a state in which an ohmic electrode 11 has just formed is illustrated, and the configuration of the upper layer than the ohmic electrode 11 is omitted. In addition, a drain electrode 14 is also omitted. The same applies to the following cross-sectional views.

FIG. 3 illustrates the configuration of the cross section of a cell portion indicated by line A-A, of the silicon carbide MOS transistor 90 illustrated in FIG. 1, and the configuration of the cross section of a terminal portion indicated by line B-B. Note that the top view configuration is identical between the silicon carbide MOS transistor 90 and the silicon carbide MOS transistor 100.

The silicon carbide MOS transistor 100 illustrated in FIG. 3 includes n-type impurity regions (added regions) 7 with a relatively high concentration provided on an upper layer portion of a drift layer 2 between adjacent well regions 3, and an upper layer portion of the drift layer 2 in the entire region of a terminal portion.

By forming the n-type impurity region with a relatively high concentration between adjacent well regions 3, that is, in a so-called JFET region, the resistance value of a current path formed inside the drift layer 2 from a channel region toward a silicon carbide substrate 1 can be reduced in a case of an on-state, and the on-resistance of the silicon carbide MOS transistor 100 can be reduced.

Furthermore, by forming the added region 7 also on the upper layer portion of the drift layer 2 on an outer side of the JTE region 16 in the terminal portion, lowering of a withstand-voltage keeping capability can be suppressed. That is, theoretically, the on-resistance of a silicon carbide MOS transistor can be made about one two-hundredth of that of a silicon MOS transistor; however, the on-resistance is not that low. This is because the channel mobility of the silicon carbide MOS transistor is extremely small. The reason for this is that the interface state density of $SiO_2/SiC$ is higher by about one digit than the interface state density of $SiO_2/Si$. It is considered that the channel mobility lowers due to Coulomb scattering caused by electrons trapped in this interface state.

As described, the interface state density is high at the $SiO_2/SiC$ interface, and electrons are likely to be trapped. In the terminal portion, since a region where an interlayer insulating film 10 and the drift layer 2 are in contact with each other exists, and electrons are trapped in the region, a depletion layer is likely to be elongated. This state is schematically illustrated in FIG. 4.

As illustrated in FIG. 4, a depletion layer VC extending from an edge portion of the JTE region 16 reaches a channel stop region 17. Note that in a case where the channel stop region 17 is not provided, the depletion layer VC reaches a chip end. Since the chip end is not provided with a protective film because dicing is performed on the chip end, and damage caused by dicing remains on the chip end, application of an electric field to the chip end becomes a cause for increasing the amounts of electric discharge and leakage current. The channel stop region 17 prevents this, and provision of the channel stop region 17 prevents the depletion layer from reaching the chip end. Note that electrons EL illustrated at the interface between the interlayer insulating film 10 and the drift layer 2 in FIG. 4 represent electrons trapped in the interface of $SiO_2/SiC$.

In contrast, by forming the added region 7 on the upper layer portion of the drift layer 2 on the outer side of the JTE region 16, elongation of the depletion layer VC can be suppressed. This state is schematically illustrated in FIG. 5.

Figure 5:
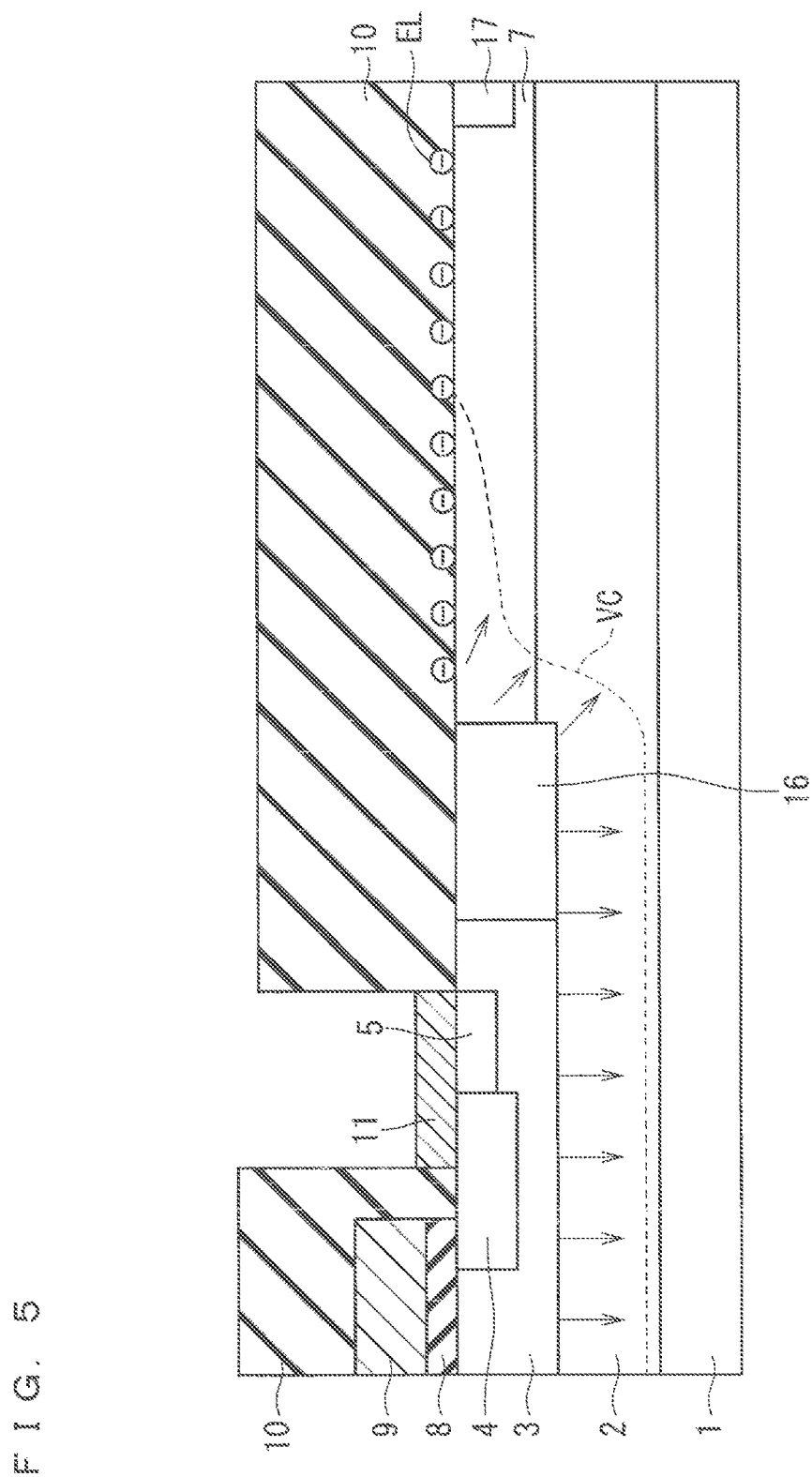
FIG. 5 is a schematic view for explaining elongation of a depletion layer in a terminal portion of the silicon carbide MOS transistor according to the first embodiment of the present invention.

As illustrated in FIG. 5, the depletion layer VC extending from the edge portion of the JTE region 16 does not reach the channel stop region 17, elongation of the depletion layer VC is suppressed, lowering of the withstand-voltage keeping capability can be suppressed, and moreover leakage current can be suppressed. In general, it is understood that widening of a depletion layer relaxes electric field concentration, and can increase withstand voltage of a semiconductor device. This is because breakdown is likely to occur at a section where the depletion layer is narrow, or a section where the curvature of a boundary line of a terminal section of the depletion layer is large and electric concentration is likely to occur, and breakdown is suppressed by widening the depletion layer and making the curvature of the boundary line of the terminal section of the depletion layer small. However, if the depletion layer is made too wide to reach the chip end, it becomes a cause for an increase in the amounts of electric discharge and leakage current as described above.

In addition, the channel stop region is formed by implanting an impurity at a high concentration by ion implantation, and due to this, many crystal defects exist in the channel stop region. If the depletion layer reaches such a channel stop region, an electric field is applied to the region where there are many crystal defects, which becomes a cause for an increase in leakage current.

In addition, since the depletion layer VC is less likely to be elongated, the size of the region to which an electric field is applied becomes small. Due to this, even in a case where there is a defect on a surface of the terminal portion or adhesion of foreign matter to the surface of the terminal portion, the possibility of the above defect or adhesion occurring to a section to which an electric field is applied is lowered, the manufacturing yield rate of SiC-MOSFETs is improved, and reliability is also improved.

<Impurity Profile>

Next, using FIGS. 6 and 7, impurity profiles of the added region 7 and the JTE region 16 will be explained. FIG. 6 is a diagram which expresses the impurity profile of the added region 7 as a box-type impurity profile, and illustrates a relationship with the impurity profile of the JTE region 16.

The impurity profile of the JTE region 16 illustrated in FIG. 6 is a profile in a case where Al (aluminum) is implanted at implantation energy of 500 keV and a dose amount of $1.39 \times 10^{13}/cm^2$ by ion implantation.

As illustrated in FIG. 6, the maximum concentration of the added region 7 is $5 \times 10^{16}/cm^3$, the maximum concentration being set to be not greater than one tenth of the peak concentration in the JTE region 16 having a peak value before the depth of 600 nm, the peak concentration being $7.5\times10^{17}/cm^3$. By adopting such a configuration, a desired withstand voltage can be obtained without dry-etching a substrate surface after implantation.

It is considered that this is because since the amount of the impurity introduced into a surface section is small, damage on the surface section (crystal defects formed by ion implantation) is little.

In addition, in formation of the JTE region 16, since implantation energy of ion implantation is made great and the location of the peak of the impurity concentration is as deep as about 600 nm in depth, the margin of etching performed for removal of a damaged layer on the surface of the JTE region 16, that is, the scope of the etching amount which enables a desired withstand voltage value to be obtained can be made wide.

FIG. 7 illustrates an impurity profile in a case where the added region 7 is formed by ion implantation, and here, an example of a case where the added region 7 is formed by ion implantation in three stages is illustrated.

As illustrated in FIG. 7, the added region 7 is formed by ion implantation in three stages, that is, ion implantation in a first stage where N (nitrogen) is implanted at implantation energy of 350 keV and a dose amount of $3.00\times10^{11}/cm^2$ by ion implantation, ion implantation in a second stage where N is implanted at implantation energy of 180 keV and a dose amount of $2.40\times10^{11}/cm^2$ by ion implantation, and ion implantation in a third stage where N is implanted at implantation energy of 75 keV and a dose amount of $2.00\times10^{11}/cm^2$ by ion implantation.

By performing ion implantation in three stages, the added region 7 has an impurity profile close to a box-type impurity profile. Note that by increasing the number of times that implantation is performed, the impurity profile becomes closer to the box-type impurity profile. In addition, in a case where the added region 7 is formed not by ion implantation but by epitaxial growth, the impurity profile becomes further closer to the box-type impurity profile.

Note that in a case where the added region 7 is formed by epitaxial growth, no implantation defect occurs and the added region 7 becomes an impurity region with excellent crystal quality; however, it is difficult to make the thickness uniform, thickness distribution occurs, and there is a variation is impurity concentration. In contrast, in a case where the added region 7 is formed by ion implantation, even though there is a possibility that an implantation defect occurs, thickness distribution and a variation in impurity concentration do not occur.

In addition, in the above, the configuration where the JTE region 16 is provided in the terminal portion is illustrated; however the terminal structure is not limited to this, and the effects of the present invention are exhibited also in a case where any of a configuration where a FLR (Field Limiting Ring) region is provided, a configuration where the JTE region and the FLR region are combined, or the like is used as long as the configuration is provided with an electric field relaxation impurity region which relaxes an electric field at the terminal portion.

<Manufacturing Method>

Next, a manufacturing method of the silicon carbide MOS transistor 100 will be explained using FIGS. 8 to 13.

First, as the silicon carbide substrate 1, a silicon carbide substrate including an n-type impurity and having specific resistance of 0.015 to 0.028 Ωcm is prepared. Silicon carbide is a wide-bandgap semiconductor having a greater bandgap than that of silicon, and since a switching device and a diode configured to include a wide-bandgap semiconductor as a substrate material have high withstand voltage property and high allowable current density, the switching device and the diode can be made smaller than a silicon semiconductor device, and by using these small-sized switching device and diode, it is possible to reduce the size of a semiconductor device module incorporating these devices.

In addition, since the switching device and the diode have high heat-resisting property, size reduction of a radiation fin of a heat sink and cooling by air-cooling in lieu of water-cooling are enabled, and further size reduction of the semiconductor device module is enabled.

Then, an n-type silicon carbide epitaxial layer is formed on an upper portion of the silicon carbide substrate 1 by epitaxial crystal growth to form the drift layer 2. Here, the impurity concentration in the drift layer 2 falls within the range, for example, from $1\times10^{15}$ to $5\times10^{16}$ $cm^{-3}$, and the thickness is 5 to 50 μm.

Figure 8:
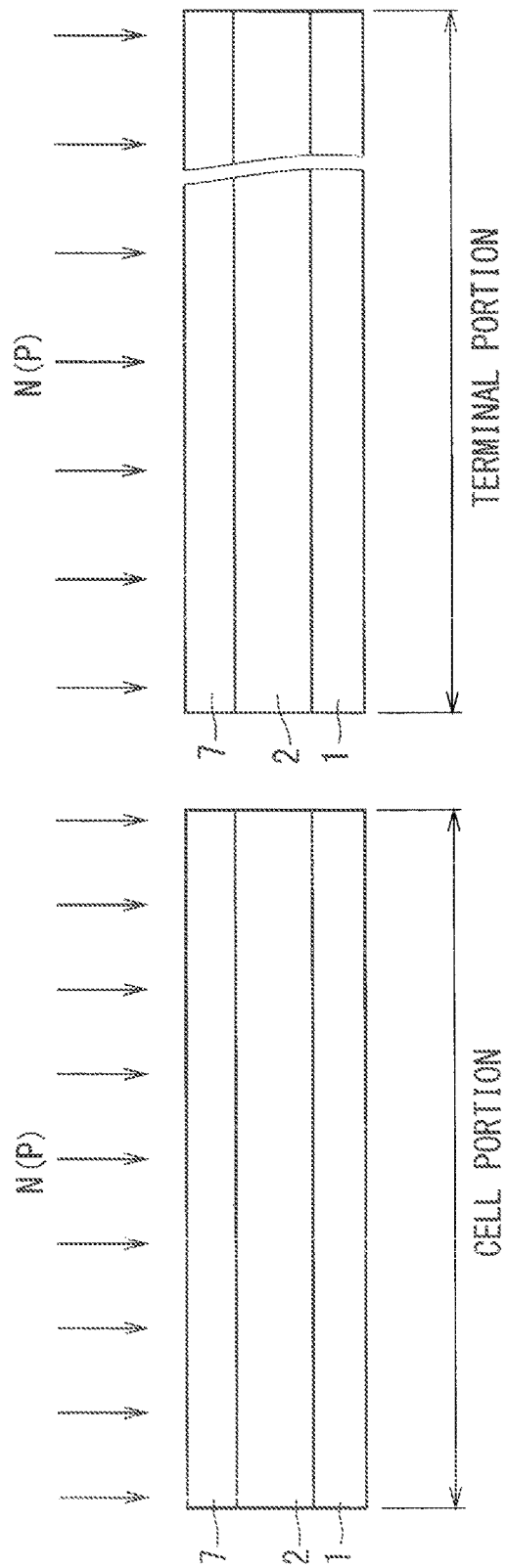
FIG. 8 is a cross-sectional view for explaining a manufacturing process of the silicon carbide MOS transistor according to the first embodiment of the present invention.

Next, in a process illustrated in FIG. 8, ion implantation of an n-type impurity such as nitride (N) or phosphorus (P) is performed from the upper portion of the drift layer 2, and the added region 7 ranging over the entire surface of the upper layer portion of the drift layer 2 is formed. Here, the added region 7 is formed such that the depth is 0.3 to 1.2 μm, the impurity concentration falls within the range from $5\times10^{15}$ to $5\times10^{17}$ $cm^{-3}$, and the concentration is higher than that in the drift layer 2.

Figure 9:
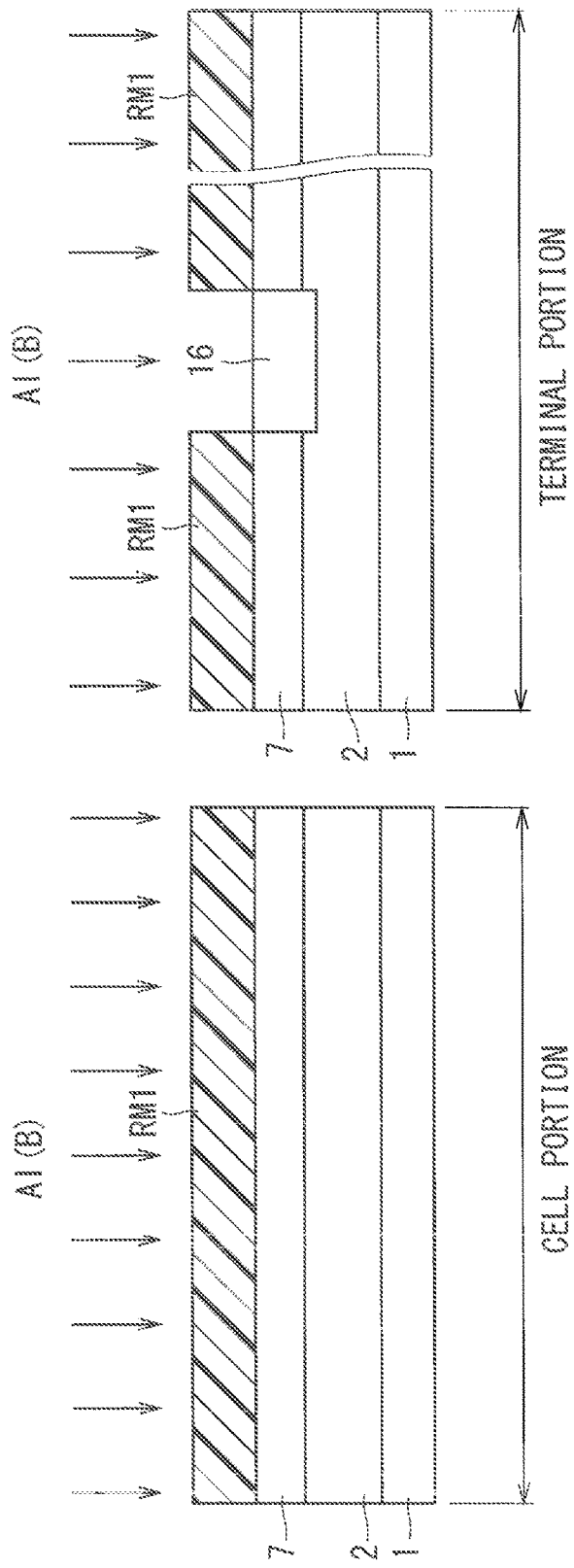
FIG. 9 is a cross-sectional view for explaining a manufacturing process of the silicon carbide MOS transistor according to the first embodiment of the present invention.

Next, a resist material is applied on the drift layer 2 after the added region 7 has been formed, patterning is performed by photolithography, and as illustrated in FIG. 9, a resist mask RM1 where a section corresponding to the JTE region 16 is an opening portion is formed. Thereafter, by using the resist mask RM1, ion implantation of a p-type impurity such as aluminum (Al), boron (B), or the like is performed, and the JTE region 16 is formed. Here, the depth of the JTE region 16 is 0.5 to 1.0 μm, and the impurity concentration falls within the range from $5\times10^{16}$ to $1\times10^{18}$ $cm^{-3}$.

Figure 10:
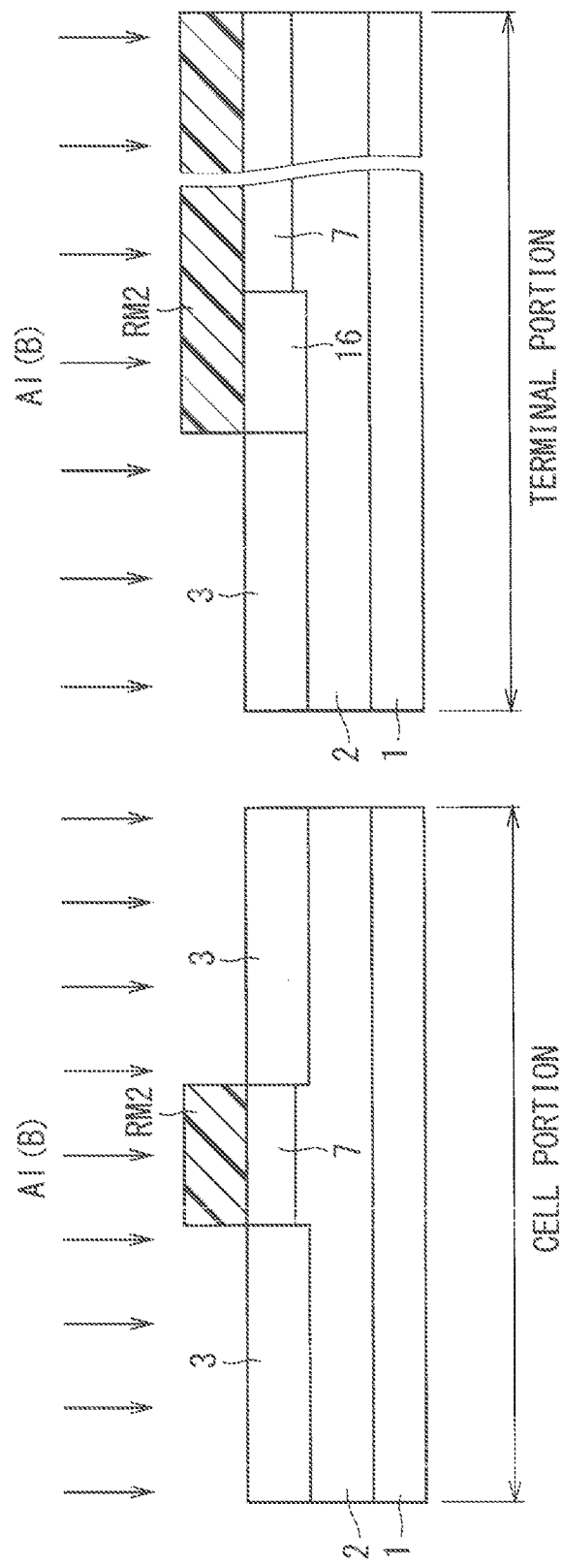
FIG. 10 is a cross-sectional view for explaining a manufacturing process of the silicon carbide MOS transistor according to the first embodiment of the present invention.

Next, after the resist mask RM1 is removed, a resist material is applied on the drift layer 2, patterning is performed by photolithography, and as illustrated in FIG. 10, a resist mask RM2 where sections corresponding to the well regions 3 are opening portions is formed. Thereafter, by using the resist mask RM2, ion implantation of a p-type impurity such as Al, B, or the like is performed, and the well regions 3 are formed. Here, the depth of the well region 3 is 0.5 to 1.0 μm, and the impurity concentration falls within the range from $1\times10^{18}$ to $5\times10^{18}$ $cm^{-3}$.

Figure 11:
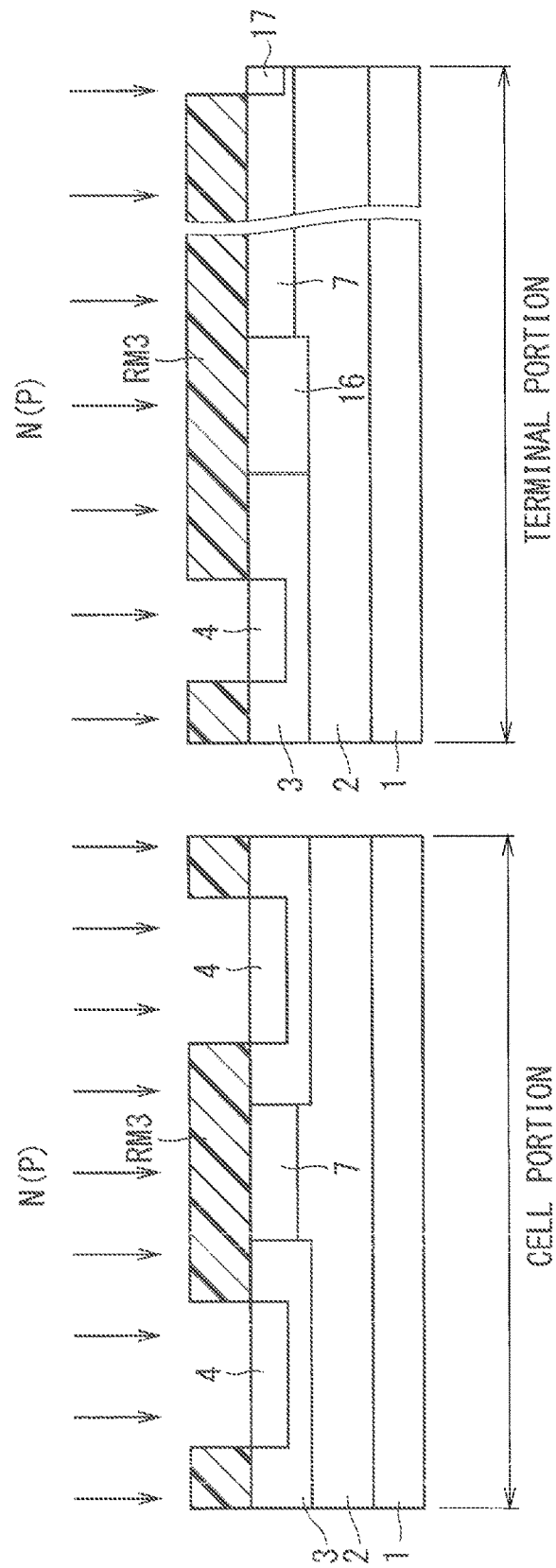
FIG. 11 is a cross-sectional view for explaining a manufacturing process of the silicon carbide MOS transistor according to the first embodiment of the present invention.

Next, after the resist mask RM2 is removed, a resist material is applied on the drift layer 2, patterning is performed by photolithography, and as illustrated in FIG. 11, a resist mask RM3 where sections corresponding to the source regions 4 and the channel stop region 17 are opening portions is formed. Thereafter, by using the resist mask RM3, ion implantation of an n-type impurity such as N, P, or the like is performed, and the source regions 4 and the channel stop region 17 are formed. Here, the depth of each of the source region 4 and the channel stop region 17 is 0.2 to 0.5 μm, and the impurity concentration falls within the range from $1\times10^{19}$ to $5\times10^{20}$ $cm^{-3}$. Note that the channel stop region 17 is not an essential configuration for the present invention, and the channel stop region 17 may not be provided. In addition, the source region 4 and the channel stop region 17 are individually formed.

Figure 12:
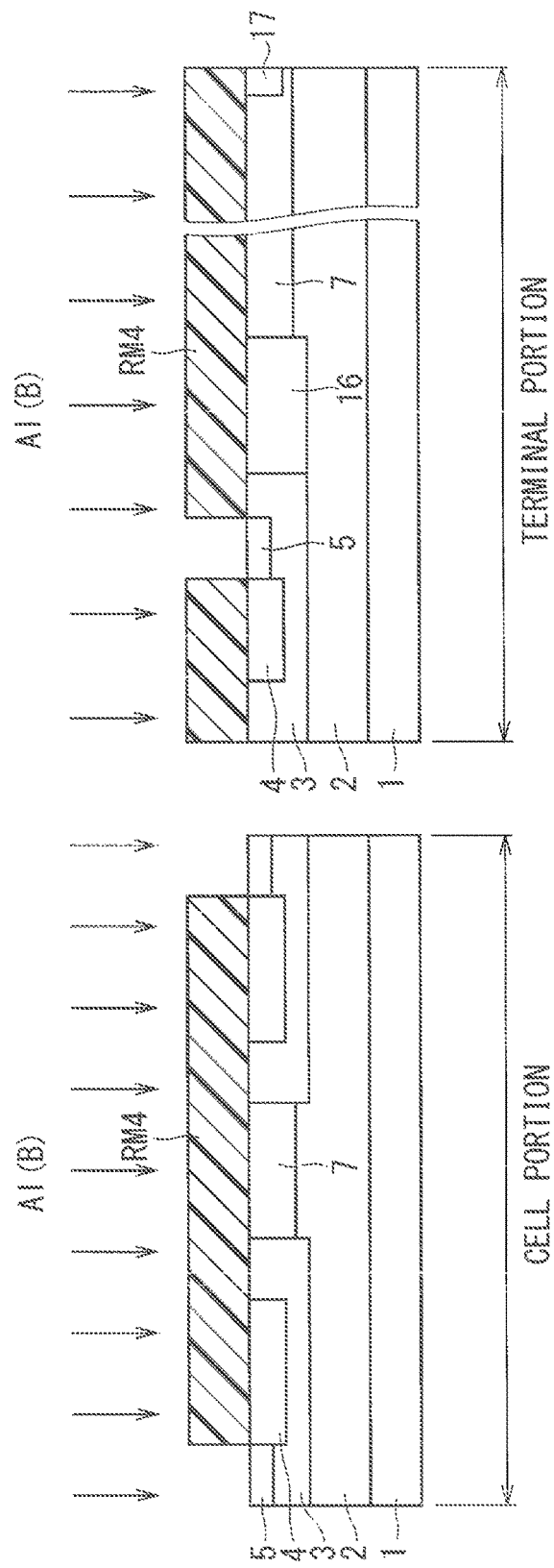
FIG. 12 is a cross-sectional view for explaining a manufacturing process of the silicon carbide MOS transistor according to the first embodiment of the present invention.

Next, after the resist mask RM3 is removed, a resist material is applied on the drift layer 2, patterning is performed by photolithography, and as illustrated in FIG. 12, a resist mask RM4 where sections corresponding to the contact regions 5 are opening portions is formed. Thereafter, by using the resist mask RM4, ion implantation of a p-type impurity such as Al, B, or the like is performed, and the contact regions 5 are formed. Here, the depth of the contact region 5 is 0.2 to 0.5 µm, and the impurity concentration falls within the range from $1 \times 10^{20}$ to $5 \times 10^{20}$ cm$^{-3}$. Note that in the above explanation, an example where a resist is used as a mask in every time ion implantation is performed has been illustrated; however, ion implantation may be performed by using a hard mask made of SiO$_2$ or the like and heating the substrate to a high temperature. In this case, there is an advantage that crystal defects generated upon implantation are reduced.

Figure 13:
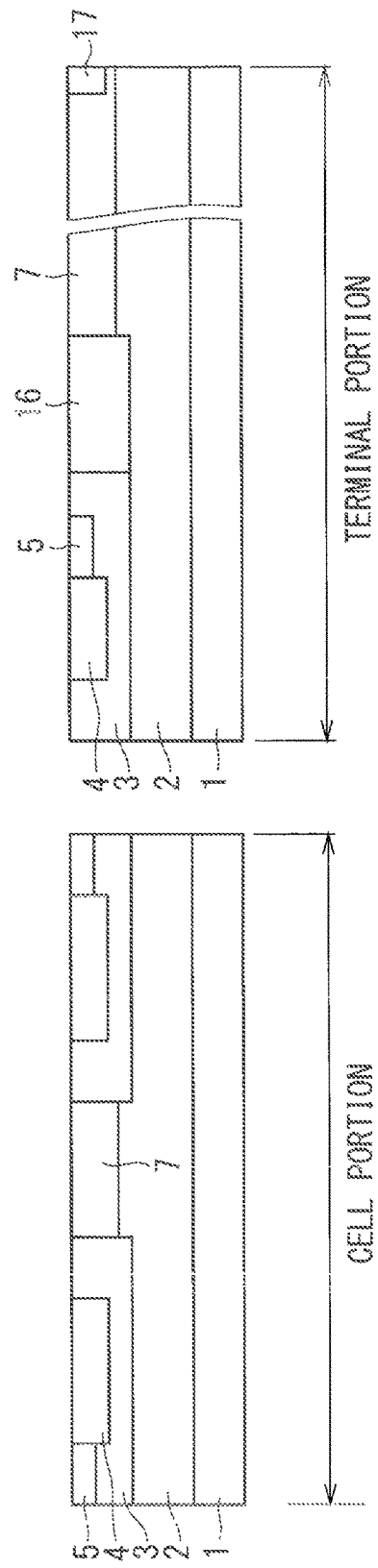
FIG. 13 is a cross-sectional view for explaining a manufacturing process of the silicon carbide MOS transistor according to the first embodiment of the present invention.

Thereafter, after the resist mask RM4 is removed, the gate insulating film 8 and the gate electrode 9 are formed on a main surface of the drift layer 2 in the state illustrated in FIG. 13, the gate insulating film 8 and the gate electrode 9 are covered with the interlayer insulating film 10, and moreover, the drift layer 2 in the terminal portion is also covered with the interlayer insulating film 10.

Then, a contact hole is provided so as to penetrate through the interlayer insulating film 10 and to reach the source region 4 and the contact region 5, and the ohmic electrode 11 made of, for example, Ni is formed on the bottom surface of the contact hole. Thus, the configuration in FIG. 3 can be obtained.

Then, the source electrode 12 (FIG. 2) is formed on the ohmic electrode 11 and the interlayer insulating film 10. In addition, the drain electrode 14 (FIG. 2) is formed on the back-surface side (side opposite to the main surface side where a source pad electrode is provided) of the silicon carbide substrate 1, and thus the silicon carbide MOS transistor 100 is obtained.

As explained above, since the added region 7 is provided so as to range over the entire surface of the upper layer portion of the drift layer 2, it is not necessary to perform selective ion implantation in formation of the added region 7, and manufacturing processes can be simplified. In addition, by forming the added region 7 by ion implantation, in comparison with a case of formation by epitaxial growth, uniformity of the impurity concentration in the substrate surface and layer thickness become more excellent, and not only on-resistance of the SiC-MOSFET but also the withstand voltage of the terminal structure are more stabilized, and the effect of improving the manufacturing yield rate of SiC-MOSFETs is obtained.

Note that an example of forming the added region 7 first has been explained above; however, in a case of using ion implantation, formation order of the added region 7 is not limited.

Second Embodiment

<Device Configuration>

Figure 14:
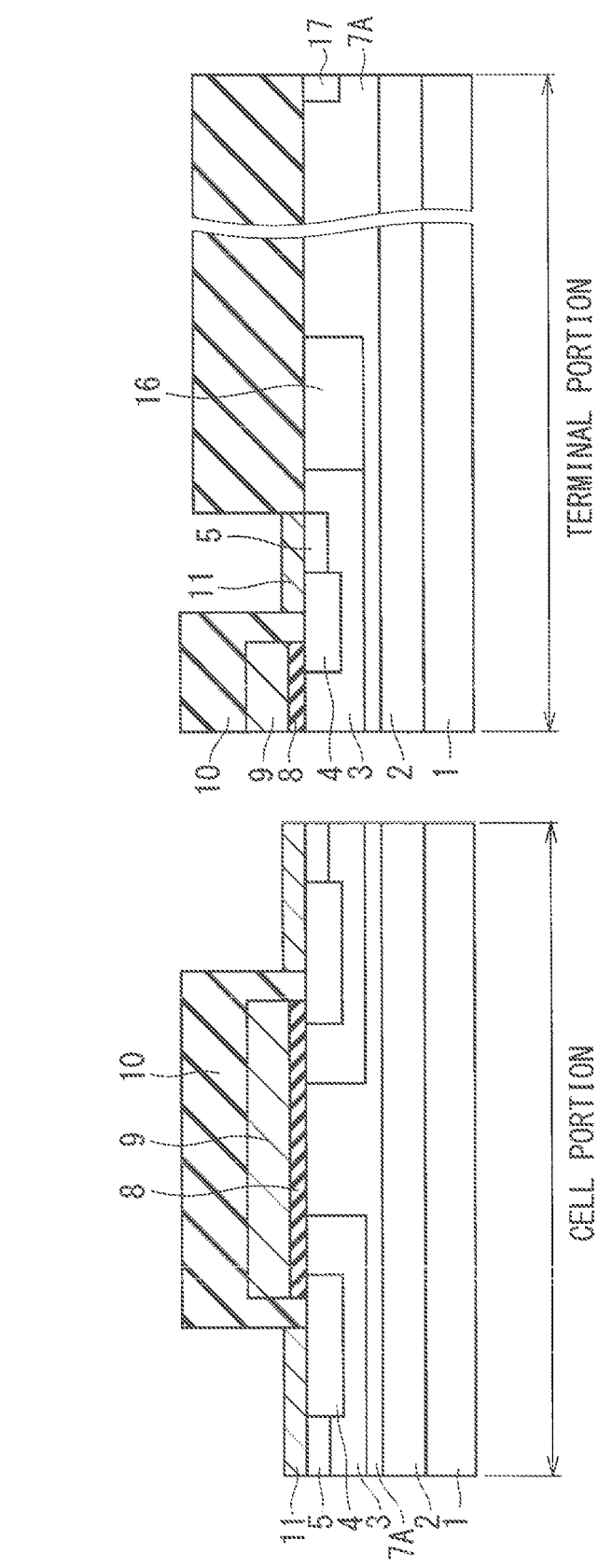
FIG. 14 is a partial cross-sectional view of a silicon carbide MOS transistor according to a second embodiment of the present invention.

FIG. 14 is a cross-sectional view illustrating cross-sectional configurations of a cell portion and a terminal portion of a silicon carbide MOS transistor 200 according to a second embodiment of the present invention. Note that identical signs are given to configurations identical to those of the silicon carbide MOS transistor 100 illustrated in FIG. 3, and overlapping explanations will be omitted.

The silicon carbide MOS transistor 200 illustrated in FIG. 14 has an added region 7A formed to be deeper than a well region 3.

By forming the added region 7A to be deeper than the well region 3, resistance of a JFET region can be further reduced, and in addition, since current is fed to a drift layer 2 via the added region 7A under the bottom surface of the well region 3, flow of current is widened, and on-resistance of the SiC-MOSFET can be further reduced.

Furthermore, since the added region 7A is also formed on the upper layer portion of the drift layer 2 in the entire region of the terminal portion, lowering of a withstand-voltage keeping capability can be suppressed.

<Impurity Profile>

Figure 15:
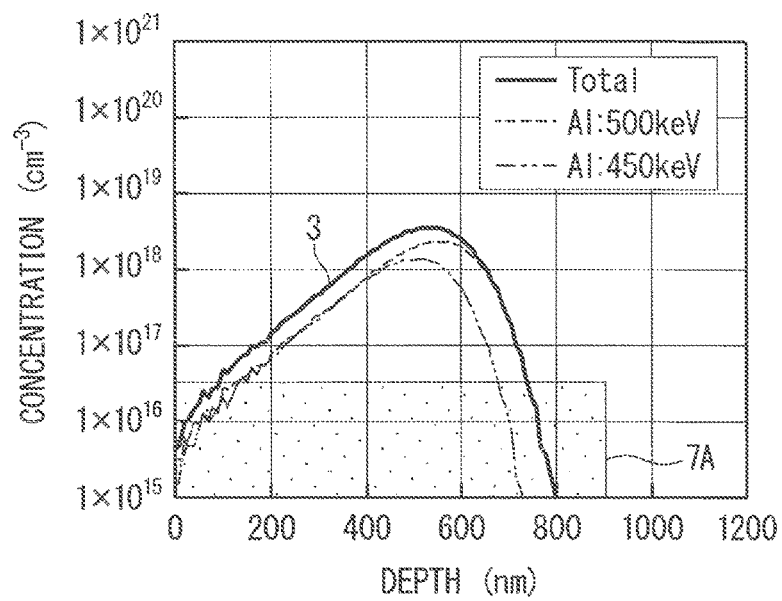
FIG. 15 is a diagram illustrating an impurity profile of the silicon carbide MOS transistor according to the second embodiment of the present invention.

Next, using FIGS. 15 and 16, impurity profiles of the added region 7A and the well region 3 will be explained. FIG. 15 is a diagram which expresses the impurity profile of the added region 7A as a box-type impurity profile, and illustrates a relationship with the impurity profile of the well region 3.

The impurity profile of the well region 3 illustrated in FIG. 15 illustrates a profile in a case where Al is implanted at implantation energy of 500 keV and a dose amount of $5.20 \times 10^{13}$/cm$^2$ by ion implantation, a profile in a case of ion implantation at implantation energy of 450 keV and a dose amount of $3.00 \times 10^{13}$/cm$^2$, and a total profile of the both.

As illustrated in FIG. 15, the maximum concentration of the added region 7A is $5 \times 10^{16}$/cm$^3$, the maximum concentration being set to be not greater than one tenth of the peak concentration in the well region 3 having a peak value before the depth of 600 nm, the peak concentration being $5 \times 10^{18}$/cm$^3$.

By providing the added region 7A and thus lowering the concentration of Al in the surface of the well region 3, channel mobility of the MOS transistor is enhanced and thus on-resistance is reduced. In addition, a threshold of the MOS transistor can be adjusted by the concentration of Al in the surface and the concentration of N in the added region 7.

In addition, the added region 7A is formed to be deeper than the well region 3, the depth to the deepest portion of the well region 3 is about 800 nm, while the depth to the deepest portion of the added region 7A is about 900 nm.

Figure 16:
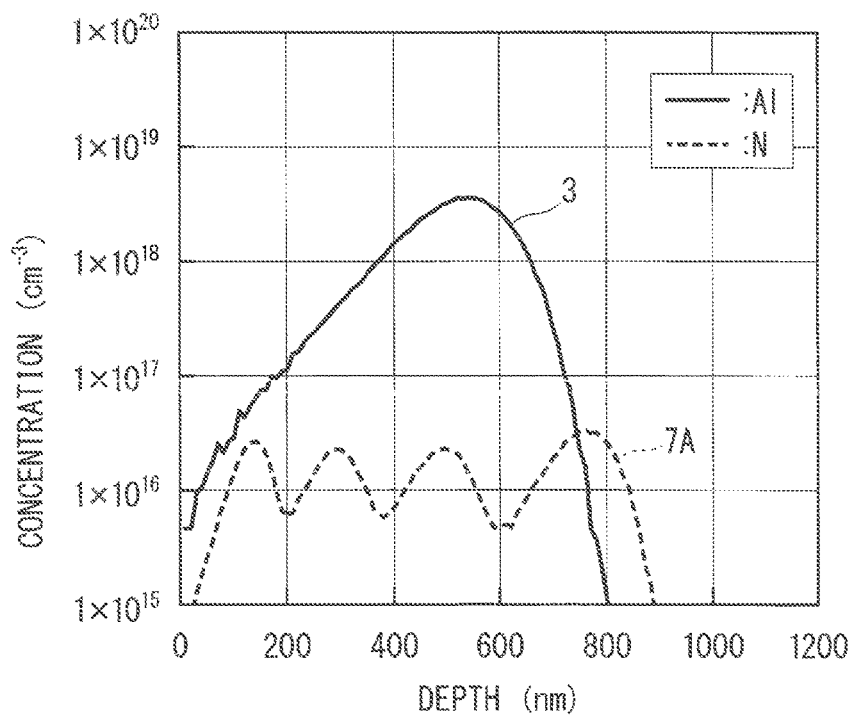
FIG. 16 is a diagram illustrating an impurity profile of the silicon carbide MOS transistor according to the second embodiment of the present invention.

FIG. 16 illustrates an impurity profile in a case where the added region 7A is formed by ion implantation, and here, an example of a case where the added region 7A is formed by ion implantation in four stages is illustrated. Note that the total profile illustrated in FIG. 15 is illustrated as the impurity profile of the well region 3.

As illustrated in FIG. 16, the added region 7A is formed by ion implantation in four stages, that is, ion implantation in a first stage where N is implanted at implantation energy of 665 keV and a dose amount of $5.00 \times 10^{11}$/cm$^2$ by ion implantation, ion implantation in a second stage where N is implanted at implantation energy of 350 keV and a dose amount of $3.00 \times 10^{11}$/cm$^2$ by ion implantation, ion implantation in a third stage where N is implanted at implantation energy of 180 keV and a dose amount of $2.40 \times 10^{11}$/cm$^2$ by ion implantation, and ion implantation in a fourth stage where N is implanted at implantation energy of 75 keV and a dose amount of $2.00 \times 10^{11}$/cm$^2$ by ion implantation.

By performing ion implantation in such four stages, the added region 7A has an impurity profile close to a box-type impurity profile. Note that by increasing the number of times that implantation is performed, the impurity profile becomes closer to the box-type impurity profile. In addition, in a case where the added region 7A is formed not by ion implantation but by epitaxial growth, the impurity profile becomes further closer to the box-type impurity profile.

Third Embodiment

<Device Configuration>

FIG. 17 is a cross-sectional view illustrating cross-sectional configurations of a cell portion and a terminal portion of a silicon carbide MOS transistor 300 according to a third embodiment of the present invention. Note that identical signs are given to configurations identical to those of the silicon carbide MOS transistor 100 illustrated in FIG. 3, and overlapping explanations will be omitted.

The silicon carbide MOS transistor 300 illustrated in FIG. 17 has an added region 7B (first added region) formed to be deeper than a well region 3, and an added region 7 (second added region) formed to be shallower than the well region 3. Then, the added region 7B is formed such that the n-type impurity concentration is higher than that in the added region 7.

By forming the added region 7B with a high impurity concentration to be deeper than the well region 3, resistance of a JFET region can be further reduced, and in addition, since current is fed to a drift layer 2 via the added region 7B under the bottom surface of the well region 3, flow of current is widened, and on-resistance of the SiC-MOSFET can be further reduced.

Furthermore, since the added region 7 and the added region 7B are also formed on an upper layer portion of the drift layer 2 in the entire region of the terminal portion, lowering of a withstand-voltage keeping capability can be suppressed.

<Impurity Profile>

Figure 18:
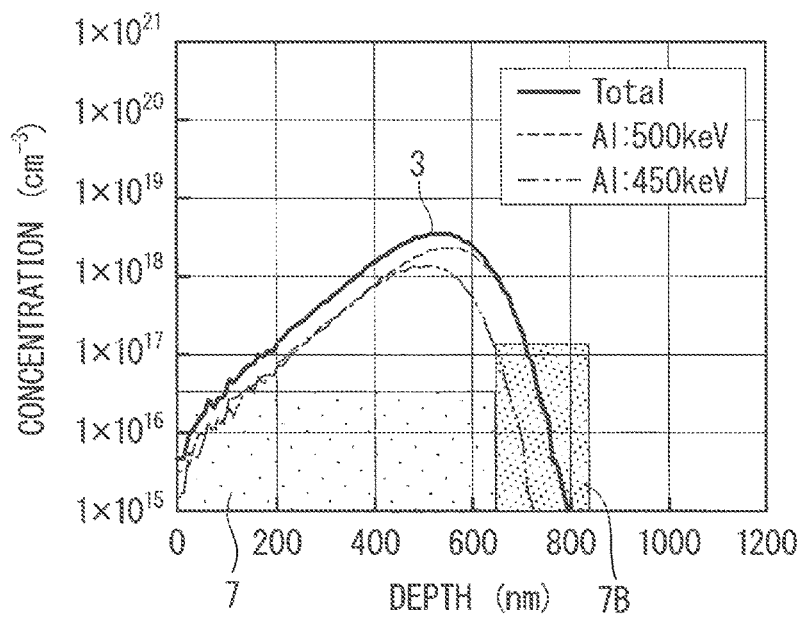
FIG. 18 is a diagram illustrating an impurity profile of the silicon carbide MOS transistor according to the third embodiment of the present invention.

Next, using FIGS. 18 and 19, impurity profiles of the added region 7, the added region 7B, the well region 3, and the JTE region 16 will be explained. FIG. 18 is a diagram which expresses the impurity profiles of the added regions 7 and 7B as box-type impurity profiles, and illustrates a relationship with the impurity profile of the well region 3.

The impurity profile of the well region 3 illustrated in FIG. 18 illustrates a profile in a case where Al is implanted at implantation energy of 500 keV and a dose amount of $5.20 \times 10^{13}/cm^2$ by ion implantation, a profile in a case of ion implantation at implantation energy of 450 keV and a dose amount of $3.00 \times 10^{13}/cm^2$, and a total profile of the both.

As illustrated in FIG. 18, the maximum concentration of the added region 7 is $5 \times 10^{16}/cm^3$, the maximum concentration being set to be not greater than one tenth of the peak concentration in the well region 3 having a peak value before the depth of 600 nm, the peak concentration being $5 \times 10^{18}/cm^3$.

By providing the added region 7 and thus lowering the concentration of Al in the surface of the well region 3, channel mobility of the MOS transistor is enhanced and thus on-resistance is reduced. In addition, a threshold of the MOS transistor can be adjusted by the concentration of Al in the surface and the concentration of N in the added region 7.

In addition, the added region 7B is formed at a depth of greater than 600 nm, which is deeper than the location of the concentration peak of the well region 3. Thus, formation of pn junction by an n-type impurity region and a p-type impurity region which both have high concentrations is prevented, and a region with high electric field intensity can be eliminated.

Figure 19:
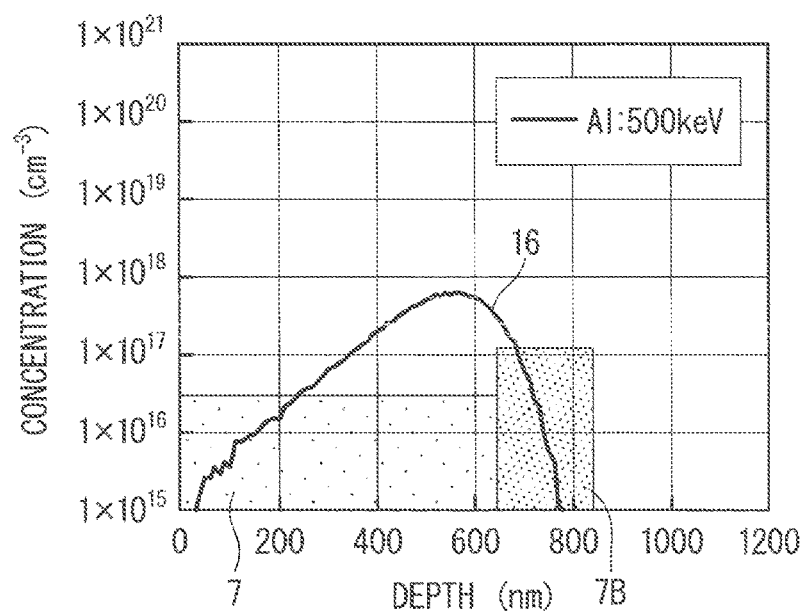
FIG. 19 is a diagram illustrating an impurity profile of the silicon carbide MOS transistor according to the third embodiment of the present invention.

FIG. 19 is a diagram which expresses the impurity profiles of the added regions 7 and 7B as box-type impurity profiles, and illustrates a relationship with the impurity profile of the JTE region 16.

The impurity profile of the JTE region 16 illustrated in FIG. 19 is a profile in a case where Al is implanted at implantation energy of 500 keV and a dose amount of $1.39 \times 10^{13}/cm^2$ by ion implantation.

As illustrated in FIG. 19, the maximum concentration of the added region 7 is $5 \times 10^{16}/cm^3$, the maximum concentration being set to be not greater than one tenth of the peak concentration in the JTE region 16 having a peak value before the depth of 600 nm, the peak concentration being $7.5 \times 10^{17}/cm^3$.

In addition, in formation of the JTE region 16, since implantation energy of ion implantation is made great and the location of the peak of the impurity concentration is as deep as about 600 nm in depth, the margin of etching performed for removal of a damaged layer on the surface of the JTE region 16, that is, the scope of the etching amount which enables a desired withstand voltage value to be obtained can be made wide.

In addition, the added region 7B is formed at a depth of greater than 600 nm, which is deeper than the location of the concentration peak of the JTE region 16. Thus, formation of pn junction by an n-type impurity region and a p-type impurity region which both have high concentrations is prevented, and a region with high electric field intensity can be eliminated.

Fourth Embodiment

<Device Configuration>

FIG. 20 is a cross-sectional view illustrating cross-sectional configurations of a cell portion and a terminal portion of a silicon carbide MOS transistor 400 according to a fourth embodiment of the present invention. Note that identical signs are given to configurations identical to those of the silicon carbide MOS transistor 100 illustrated in FIG. 3, and overlapping explanations will be omitted.

The silicon carbide MOS transistor 400 illustrated in FIG. 20 has an added region 7A formed to be deeper than a well region 3.

By forming the added region 7A to be deeper than the well region 3, resistance of a JFET region can be further reduced, and in addition, since current is fed to a drift layer 2 via the added region 7A under the bottom surface of the well region 3, flow of current is widened, and on-resistance of the SiC-MOSFET can be further reduced.

Furthermore, since the added region 7A is also formed on an upper layer portion of the drift layer 2 in the entire region of the terminal portion, lowering of a withstand-voltage keeping capability can be suppressed.

In addition, in the silicon carbide MOS transistor 400, since the added region 7A is formed to be shallower than a JTE region 16 and to be deeper than the well region 3, the JTE region 16 forms pn junction with the drift layer 2 with a low concentration, the electric field intensity of the terminal portion can be lowered, withstand voltage is stabilized, and reliability of the SiC-MOSFET can be improved.

<Impurity Profile>

Next, using FIGS. 21 and 22, impurity profiles of the added region 7A, the well region 3, and the JTE region 16 will be explained.

Figure 21:
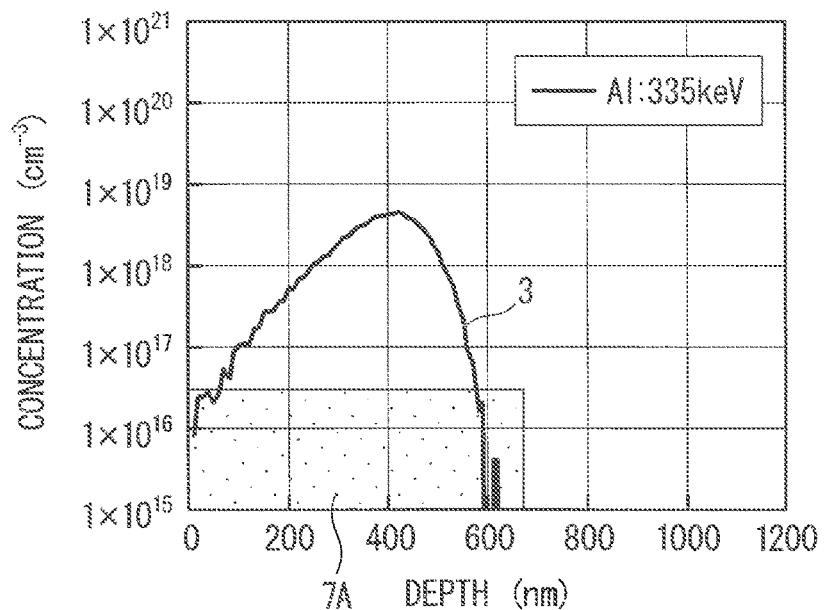
FIG. 21 is a diagram illustrating an impurity profile of the silicon carbide MOS transistor according to the fourth embodiment of the present invention.

FIG. 21 is a diagram which expresses the impurity profile of the added region 7A as a box-type impurity profile, and illustrates a relationship with the impurity profile of the well region 3.

The impurity profile of the well region 3 illustrated in FIG. 21 illustrates a profile in a case where Al is implanted at implantation energy of 335 keV and a dose amount of $8.20 \times 10^{13}/cm^2$ by ion implantation.

As illustrated in FIG. 21, the maximum concentration of the added region 7A is $5\times10^{16}$/cm$^3$, the maximum concentration being set to be is not greater than one tenth of the peak concentration in the well region 3 having a peak value at the depth of about 400 nm, the peak concentration being $5\times10^{18}$/cm$^3$.

By providing the added region 7A and thus lowering the concentration of Al in the surface of the well region 3, channel mobility of the MOS transistor is enhanced and thus on-resistance is reduced. In addition, a threshold of the MOS transistor can be adjusted by the concentration of Al in the surface and the concentration of N in the added region 7A.

Figure 22:
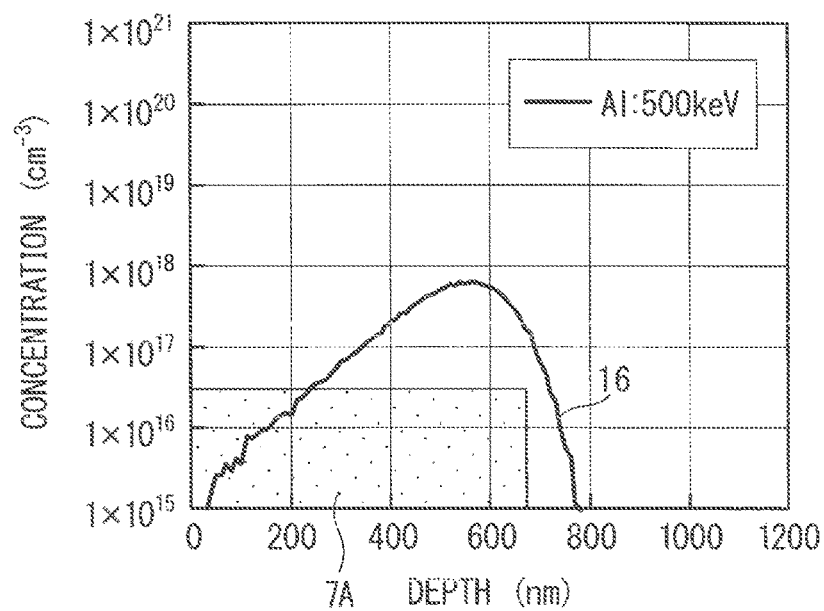
FIG. 22 is a diagram illustrating an impurity profile of the silicon carbide MOS transistor according to the fourth embodiment of the present invention.

FIG. 22 is a diagram which expresses the impurity profile of the added region 7A as a box-type impurity profile, and illustrates a relationship with the impurity profile of the JTE region 16.

The impurity profile of the JTE region 16 illustrated in FIG. 22 is a profile in a case where Al is implanted at implantation energy of 500 keV and a dose amount of $1.39\times10^{13}$/cm$^2$ by ion implantation.

As illustrated in FIG. 22, the maximum concentration of the added region 7A is $5\times10^{16}$/cm$^3$, the maximum concentration being set to be not greater than one tenth of the peak concentration in the JTE region 16 having a peak value before the depth of 600 nm, the peak concentration being $7.5\times10^{17}$/cm$^3$.

In addition, since the added region 7A is formed to be not greater than one tenth of the peak concentration in the JTE region 16, a desired withstand voltage can be obtained without dry-etching a substrate surface after implantation.

In addition, in formation of the JTE region 16, since implantation energy of ion implantation is made great and the location of the peak of the impurity concentration is as deep as about 600 nm in depth, the margin of etching performed for removal of a damaged layer on the surface of the JTE region 16, that is, the scope of the etching amount which enables a desired withstand voltage value to be obtained can be made wide.

Fifth Embodiment

<Device Configuration>

Figure 23:
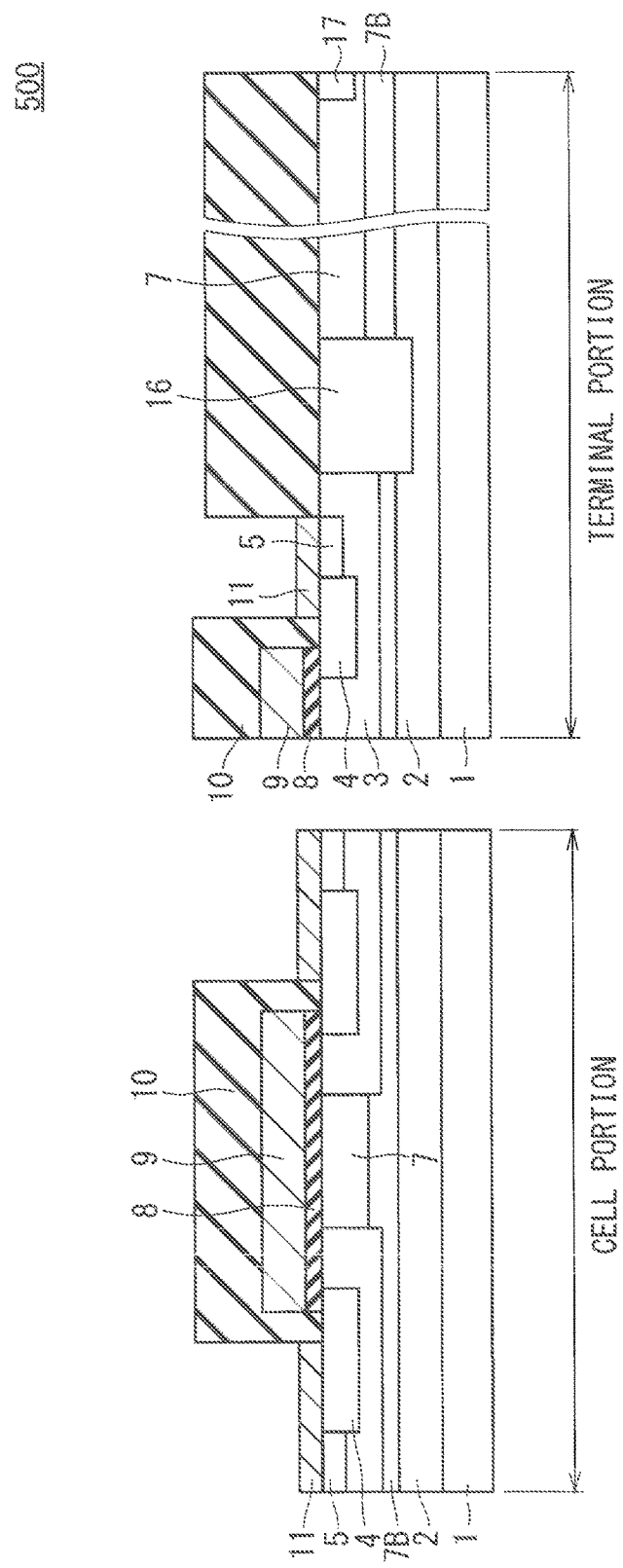
FIG. 23 is a partial cross-sectional view of a silicon carbide MOS transistor according to a fifth embodiment of the present invention.

FIG. 23 is a cross-sectional view illustrating cross-sectional configurations of a cell portion and a terminal portion of a silicon carbide MOS transistor 500 according to a fifth embodiment of the present invention. Note that identical signs are given to configurations identical to those of the silicon carbide MOS transistor 100 illustrated in FIG. 3, and overlapping explanations will be omitted.

The silicon carbide MOS transistor 500 illustrated in FIG. 23 has an added region 7B formed to be deeper than a well region 3, and an added region 7 formed to be shallower than the well region 3. In addition, the added region 7B is formed such that n-type impurity concentration is higher than that in the added region 7.

By forming the added region 7B with a high impurity concentration to be deeper than the well region 3, resistance of a JFET region can be further reduced, and in addition, since current is fed to a drift layer 2 via the added region 7B under the bottom surface of the well region 3, flow of current is widened, and on-resistance of the SiC-MOSFET can be further reduced.

Furthermore, since the added regions 7 and 7B are also formed on an upper layer portion of the drift layer 2 in the entire region of the terminal portion, lowering of a withstand-voltage keeping capability can be suppressed.

In addition, in the silicon carbide MOS transistor 500, since the added region 7B is formed to be shallower than a JTE region 16 and to be deeper than the well region 3, the JTE region 16 forms pn junction with the drift layer 2 with a low concentration, the electric field intensity of the terminal portion can be lowered, withstand voltage is stabilized, and reliability can be improved.

<Impurity Profile>

Figure 24:
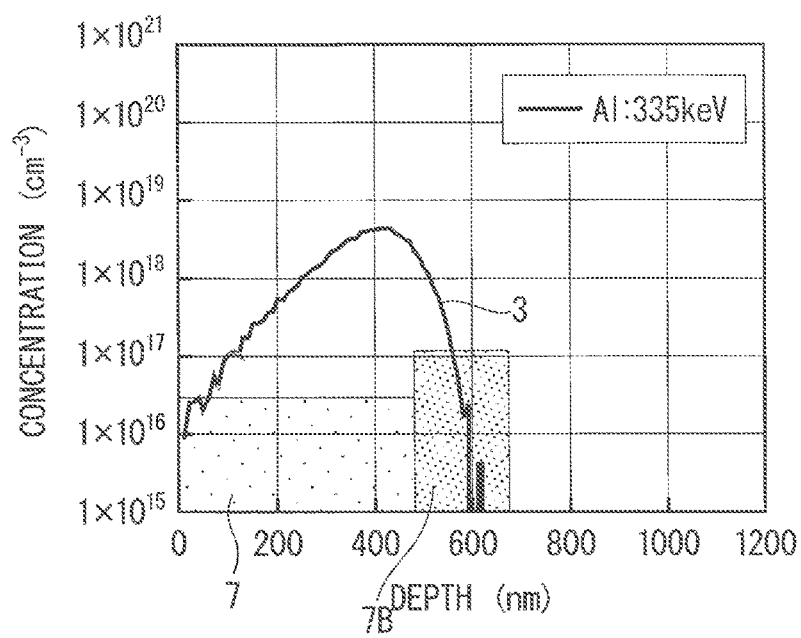
FIG. 24 is a diagram illustrating an impurity profile of the silicon carbide MOS transistor according to the fifth embodiment of the present invention.

Next, using FIGS. 24 and 25, impurity profiles of the added region 7, the added region 7B, the well region 3, and the JTE region 16 will be explained. FIG. 24 is a diagram which expresses the impurity profiles of the added regions 7 and 7B as box-type impurity profiles, and illustrates a relationship with the impurity profile of the well region 3.

The impurity profile of the well region 3 illustrated in FIG. 24 illustrates a profile in a case where Al is implanted at implantation energy of 335 keV and a dose amount of $8.20\times10^{13}$/cm$^2$ by ion implantation.

As illustrated in FIG. 24, the maximum concentration of the added region 7 is $5\times10^{16}$/cm$^3$, the maximum concentration being set to be not greater than one tenth of the peak concentration in the well region 3 having a peak value at the depth of about 400 nm, the peak concentration being $5\times10^{18}$/cm$^3$.

By providing the added region 7 and thus lowering the concentration of Al in the surface of the well region 3, channel mobility of the MOS transistor is enhanced and thus on-resistance is reduced. In addition, a threshold of the MOS transistor can be adjusted by the concentration of Al in the surface and the concentration of N in the added region 7.

In addition, the added region 7B is formed at a depth of greater than 400 nm, which is deeper than the location of the concentration peak of the well region 3. Thus, formation of pn junction by an n-type impurity region and a p-type impurity region which both have high concentrations is prevented, and a region with high electric field intensity can be eliminated.

Figure 25:
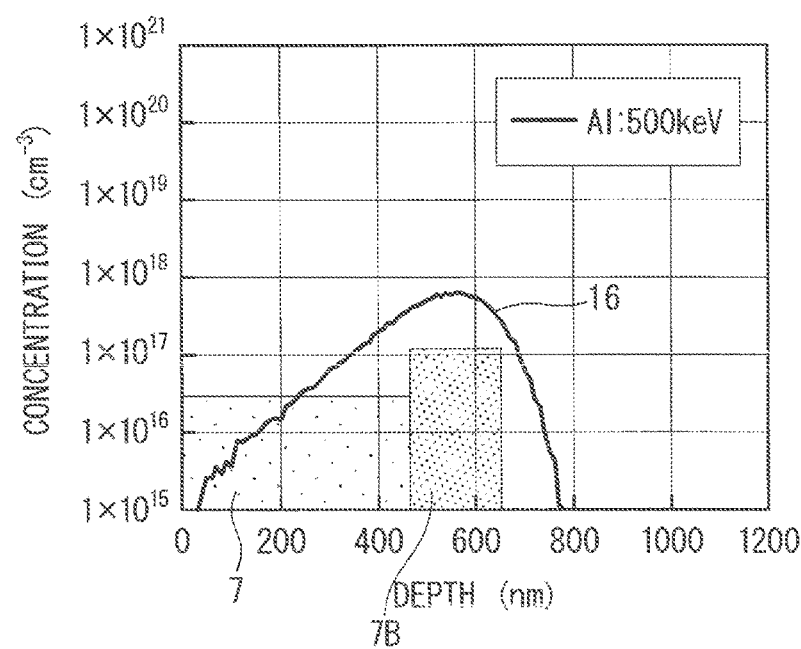
FIG. 25 is a diagram illustrating an impurity profile of the silicon carbide MOS transistor according to the fifth embodiment of the present invention.

FIG. 25 is a diagram which expresses the impurity profiles of the added regions 7 and 7B as box-type impurity profiles, and illustrates a relationship with the impurity profile of the JTE region 16.

The impurity profile of the JTE region 16 illustrated in FIG. 25 is a profile in a case where Al is implanted at implantation energy of 500 keV and a dose amount of $1.39\times10^{13}$/cm$^2$ by ion implantation.

As illustrated in FIG. 25, the maximum concentration of the added region 7 is $5\times10^{16}$/cm$^3$, the maximum concentration being set to be not greater than one tenth of the peak concentration in the JTE region 16 having a peak value before the depth of 600 nm, the peak concentration being $7.5\times10^{17}$/cm$^3$.

In addition, since the added region 7 is formed to be not greater than one tenth of the peak concentration in the JTE region 16, a desired withstand voltage can be obtained without dry-etching a substrate surface after implantation.

In addition, in formation of the JTE region 16, since implantation energy of ion implantation is made great and the location of the peak of the impurity concentration is as deep as about 600 nm in depth, the margin of etching performed for removal of a damaged layer on the surface of the JTE region 16, that is, the scope of the etching amount which enables a desired withstand voltage to be obtained can be made wide.

In addition, in the above explanation, an n-channel type MOSFET is adopted as an example; however, it is possible to apply the present invention to a p-channel type MOSFET. In a case of a p-channel type, an added region is a p-type, and by using boron (B), which has small mass, as an impurity in that case, implantation energy can be made low.

In addition, the application of the present invention is not limited to a MOSFET, and the present invention can be applied to a switching device such as an IGBT (Insulated Gate Bipolar Transistor).

Note that embodiments of the present invention can be appropriately modified or omitted within the scope of the invention.

The invention claimed is:

1. A power semiconductor device comprising:
a first conductivity-type silicon carbide semiconductor layer;
a switching device which is formed on said first conductivity-type silicon carbide semiconductor layer;
a second conductivity-type electric field relaxation impurity region which is formed in a terminal portion of a formation region of said switching device and which relaxes an electric field of said terminal portion; and
a first conductivity-type added region provided between second conductivity-type well regions of a plurality of unit cells that constitutes said switching device, the first conductivity-type added region provided at least on an outer side of said electric field relaxation impurity region, and the first conductivity-type added region having an impurity concentration higher than an impurity concentration in said silicon carbide semiconductor layer.

2. The power semiconductor device according to claim 1, wherein said added region is formed to be deeper than each of said well regions.

3. The power semiconductor device according to claim 2, wherein said added region is formed to be shallower than said electric field relaxation impurity region.

4. The power semiconductor device according to claim 2, wherein said added region has a first conductivity-type impurity concentration not greater than one tenth of a second conductivity-type impurity concentration in said electric field relaxation impurity region.

5. The power semiconductor device according to claim 1, wherein
said added region includes a first added region which is formed to be deeper than each of said well regions, and a second added region which is formed to be shallower than each of said well regions,
and said first added region has a first conductivity-type impurity concentration higher than a first conductivity-type impurity concentration in said second added region.

6. The power semiconductor device according to claim 5, wherein said first added region is formed to be shallower than said electric field relaxation impurity region.

7. The power semiconductor device according to claim 5, wherein said second added region has a first conductivity-type impurity concentration not greater than one tenth of a second conductivity-type impurity concentration in said electric field relaxation impurity region.

8. The power semiconductor device according to claim 1, wherein said added region is formed on an entire region of an upper layer portion of said silicon carbide semiconductor layer.

9. The power semiconductor device according to claim 1, wherein said electric field relaxation impurity region includes at least one of a JTE (Junction Termination Extension) region and a FLR (Field Limiting Ring) region.

10. The power semiconductor device according to claim 3, wherein said added region has a first conductivity-type impurity concentration not greater than one tenth of a second conductivity-type impurity concentration in said electric field relaxation impurity region.

11. The power semiconductor device according to claim 6, wherein said second added region has a first conductivity-type impurity concentration not greater than one tenth of a second conductivity-type impurity concentration in said electric field relaxation impurity region.

12. The power semiconductor device according to claim 1, wherein the first conductivity-type added region includes a first portion between the second conductivity-type well regions and a second portion on a side of said electric field relaxation impurity region in a direction outward from the first portion.

* * * * *